US008211510B1

(12) United States Patent
Varadarajan et al.

(10) Patent No.: US 8,211,510 B1
(45) Date of Patent: Jul. 3, 2012

(54) CASCADED CURE APPROACH TO FABRICATE HIGHLY TENSILE SILICON NITRIDE FILMS

(75) Inventors: Bhadri Varadarajan, Beaverton, OR (US); Gengwei Jiang, Lake Oswego, OR (US); Sirish K. Reddy, Hillsboro, OR (US); James S. Sims, Tigard, OR (US)

(73) Assignee: Novellus Systems, Inc., San Jose, CA (US)

( * ) Notice: Subject to any disclaimer, the term of this patent is extended or adjusted under 35 U.S.C. 154(b) by 1310 days.

(21) Appl. No.: 11/897,838

(22) Filed: Aug. 31, 2007

(51) Int. Cl.
*B05D 3/06* (2006.01)

(52) U.S. Cl. ........ 427/558; 427/492; 427/493; 427/508; 427/509; 427/553; 427/541; 427/542

(58) Field of Classification Search .................. 427/558, 427/569, 532, 492, 493, 508, 509, 541, 542, 427/553
See application file for complete search history.

(56) References Cited

U.S. PATENT DOCUMENTS

| | | | |
|---|---|---|---|
| 3,983,385 A | 9/1976 | Troue | |
| 4,357,451 A | 11/1982 | McDaniel | |
| 4,391,663 A | 7/1983 | Hutter, III | |
| 4,563,589 A | 1/1986 | Scheffer | |
| 4,885,262 A | 12/1989 | Ting et al. | |
| 5,178,682 A | 1/1993 | Tsukamoto et al. | |
| 5,268,320 A | 12/1993 | Holler et al. | |
| 5,282,121 A | 1/1994 | Bornhorst et al. | |
| 5,504,042 A | 4/1996 | Cho et al. | |
| 5,582,880 A | 12/1996 | Mochizuki et al. | |
| 5,686,054 A | 11/1997 | Barthel et al. | |
| 5,700,844 A | 12/1997 | Hedrick et al. | |
| 5,789,027 A | 8/1998 | Watkins et al. | |
| 5,812,403 A | 9/1998 | Fong et al. | |
| 5,840,600 A | 11/1998 | Yamazaki et al. | |
| 5,851,715 A | 12/1998 | Barthel et al. | |
| 5,858,457 A | 1/1999 | Brinker et al. | |
| 5,876,798 A | 3/1999 | Vassiliev | |
| 5,877,095 A | 3/1999 | Tamura et al. | |
| 6,015,503 A | 1/2000 | Butterbaugh et al. | |
| 6,098,637 A | 8/2000 | Parke | |
| 6,132,814 A | 10/2000 | Livesay et al. | |
| 6,136,680 A | 10/2000 | Lai et al. | |

(Continued)

FOREIGN PATENT DOCUMENTS

JP 62-229833 10/1987

(Continued)

OTHER PUBLICATIONS

U.S. Office Action mailed Apr. 3, 2008, from U.S Appl. No. 10/982,654.

(Continued)

*Primary Examiner* — Michael Cleveland
*Assistant Examiner* — Xiao Zhao
(74) *Attorney, Agent, or Firm* — Weaver Austin Villeneuve & Sampson LLP

(57) ABSTRACT

A highly tensile dielectric layer is generated on a heat sensitive substrate while not exceeding thermal budget constraints. Cascaded ultraviolet (UV) irradiation is used to produce highly tensile films to be used, for example, in strained NMOS transistor architectures. Successive UV radiation of equal or shorter wavelengths with variable intensity and duration selectively breaks bonds in the Si—N matrix and minimizes shrinkage and film relaxation. Higher tensile stress than a non-cascaded approach may be obtained.

25 Claims, 7 Drawing Sheets

U.S. PATENT DOCUMENTS

| | | | |
|---|---|---|---|
| 6,140,252 A | 10/2000 | Cho et al. | |
| 6,150,272 A | 11/2000 | Liu et al. | |
| 6,228,563 B1 | 5/2001 | Starov et al. | |
| 6,232,248 B1 | 5/2001 | Shinriki et al. | |
| 6,254,689 B1 | 7/2001 | Meder | |
| 6,268,288 B1 | 7/2001 | Hautala et al. | |
| 6,270,846 B1 | 8/2001 | Brinker et al. | |
| 6,271,273 B1 | 8/2001 | You et al. | |
| 6,290,589 B1 | 9/2001 | Tolles | |
| 6,329,017 B1 | 12/2001 | Liu et al. | |
| 6,329,062 B1 | 12/2001 | Gaynor | |
| 6,340,628 B1 | 1/2002 | Van Cleemput et al. | |
| 6,365,266 B1 | 4/2002 | MacDougall et al. | |
| 6,383,466 B1 | 5/2002 | Domansky et al. | |
| 6,383,955 B1 | 5/2002 | Matsuki et al. | |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,394,797 B1 | 5/2002 | Sugaya et al. | |
| 6,399,212 B1 | 6/2002 | Sakai et al. | |
| 6,420,441 B1 | 7/2002 | Allen et al. | |
| 6,444,715 B1 | 9/2002 | Mukherjee et al. | |
| 6,467,491 B1 | 10/2002 | Sugiura et al. | |
| 6,479,374 B1 | 11/2002 | Ioka et al. | |
| 6,479,409 B2 | 11/2002 | Shioya et al. | |
| 6,485,599 B1 | 11/2002 | Glownia et al. | |
| 6,518,130 B1 | 2/2003 | Ohno | |
| 6,531,193 B2 | 3/2003 | Fonash et al. | |
| 6,534,395 B2 | 3/2003 | Werkhoven et al. | |
| 6,548,113 B1 | 4/2003 | Birnbaum et al. | |
| 6,558,755 B2 | 5/2003 | Berry et al. | |
| 6,563,092 B1 | 5/2003 | Shrinivasan et al. | |
| 6,566,278 B1 | 5/2003 | Harvey et al. | |
| 6,576,300 B1 | 6/2003 | Berry et al. | |
| 6,596,654 B1 | 7/2003 | Bayman et al. | |
| 6,635,575 B1 | 10/2003 | Xia et al. | |
| 6,644,786 B1 | 11/2003 | Leben | |
| 6,677,251 B1 | 1/2004 | Lu et al. | |
| 6,740,602 B1 | 5/2004 | Hendriks et al. | |
| 6,740,605 B1 | 5/2004 | Shiraiwa et al. | |
| 6,756,085 B2 | 6/2004 | Waldfried et al. | |
| 6,759,098 B2 | 7/2004 | Han et al. | |
| 6,770,866 B2 | 8/2004 | Retschke et al. | |
| 6,797,643 B2 | 9/2004 | Rocha-Alvarez et al. | |
| 6,805,801 B1 | 10/2004 | Humayun et al. | |
| 6,812,043 B2 | 11/2004 | Bao et al. | |
| 6,831,284 B2 | 12/2004 | Demos et al. | |
| 6,835,417 B2 | 12/2004 | Saenger et al. | |
| 6,848,458 B1 | 2/2005 | Shrinivasan et al. | |
| 6,856,712 B2 | 2/2005 | Fauver et al. | |
| 6,884,738 B2 | 4/2005 | Asai et al. | |
| 6,902,440 B2 | 6/2005 | Dougan et al. | |
| 6,921,727 B2 | 7/2005 | Chiang et al. | |
| 6,958,301 B2 | 10/2005 | Kim et al. | |
| 6,967,160 B1 | 11/2005 | Paton et al. | |
| 7,005,390 B2 | 2/2006 | Ramachandrarao et al. | |
| 7,018,918 B2 | 3/2006 | Kloster et al. | |
| 7,030,041 B2 | 4/2006 | Li et al. | |
| 7,094,713 B1 | 8/2006 | Niu et al. | |
| 7,112,541 B2 | 9/2006 | Xia et al. | |
| 7,132,334 B2 | 11/2006 | Lin | |
| 7,144,606 B2 | 12/2006 | Huang | |
| 7,148,155 B1 | 12/2006 | Tarafdar et al. | |
| 7,166,531 B1 | 1/2007 | van den Hoek et al. | |
| 7,176,144 B1 | 2/2007 | Wang et al. | |
| 7,208,389 B1 | 4/2007 | Tipton et al. | |
| 7,235,459 B2 | 6/2007 | Sandhu | |
| 7,241,704 B1 | 7/2007 | Wu et al. | |
| 7,244,672 B2 | 7/2007 | Nguyen et al. | |
| 7,247,582 B2 | 7/2007 | Stern et al. | |
| 7,253,125 B1 | 8/2007 | Bandyopadhyay et al. | |
| 7,256,111 B2 | 8/2007 | Lopatin et al. | |
| 7,265,061 B1 | 9/2007 | Cho et al. | |
| 7,304,302 B1 | 12/2007 | Nunan et al. | |
| 7,332,445 B2 | 2/2008 | Lukas et al. | |
| 7,381,659 B2 | 6/2008 | Nguyen et al. | |
| 7,390,537 B1 | 6/2008 | Wu et al. | |
| 7,394,067 B1 | 7/2008 | Soltz et al. | |
| 7,402,532 B2 | 7/2008 | Clevenger et al. | |
| 7,481,882 B2 | 1/2009 | Won et al. | |
| 7,504,663 B2 | 3/2009 | Yamazaki et al. | |
| 7,510,982 B1 | 3/2009 | Draeger et al. | |
| 7,611,757 B1 | 11/2009 | Bandyopadhyay et al. | |
| 7,622,162 B1 | 11/2009 | Schravendijk et al. | |
| 7,705,431 B1 | 4/2010 | Sanganeria et al. | |
| 7,790,633 B1 | 9/2010 | Tarafdar et al. | |
| 7,851,232 B2 | 12/2010 | van Schravendijk et al. | |
| 7,858,533 B2 | 12/2010 | Liu et al. | |
| 7,906,174 B1 | 3/2011 | Wu et al. | |
| 8,043,667 B1 | 10/2011 | Bandyopadhyay et al. | |
| 2001/0001501 A1 | 5/2001 | Lee et al. | |
| 2001/0014512 A1 | 8/2001 | Lyons et al. | |
| 2002/0001973 A1 | 1/2002 | Wu et al. | |
| 2002/0015850 A1 | 2/2002 | Nakamura et al. | |
| 2002/0016085 A1 | 2/2002 | Huang et al. | |
| 2002/0034626 A1 | 3/2002 | Liu et al. | |
| 2002/0064341 A1 | 5/2002 | Fauver et al. | |
| 2002/0106500 A1 | 8/2002 | Albano et al. | |
| 2002/0117109 A1 | 8/2002 | Hazelton et al. | |
| 2002/0123218 A1 | 9/2002 | Shioya et al. | |
| 2002/0123240 A1 | 9/2002 | Gallagher et al. | |
| 2002/0172766 A1 | 11/2002 | Laxman et al. | |
| 2002/0195683 A1 | 12/2002 | Kim et al. | |
| 2003/0013280 A1 | 1/2003 | Yamanaka | |
| 2003/0015764 A1 | 1/2003 | Raaijmakers et al. | |
| 2003/0064604 A1 | 4/2003 | Umeda | |
| 2003/0064607 A1 | 4/2003 | Leu et al. | |
| 2003/0068881 A1 | 4/2003 | Xia et al. | |
| 2003/0134038 A1 | 7/2003 | Paranjpe | |
| 2003/0157248 A1 | 8/2003 | Watkins et al. | |
| 2003/0157267 A1 | 8/2003 | Waldfried et al. | |
| 2003/0199603 A1 | 10/2003 | Walker et al. | |
| 2003/0227087 A1 | 12/2003 | Kakamu et al. | |
| 2003/0228769 A1 | 12/2003 | Chen et al. | |
| 2003/0228770 A1 | 12/2003 | Lee et al. | |
| 2004/0004247 A1 | 1/2004 | Forbes et al. | |
| 2004/0018319 A1 | 1/2004 | Waldfried et al. | |
| 2004/0022960 A1 | 2/2004 | Rhee et al. | |
| 2004/0023513 A1 | 2/2004 | Aoyama et al. | |
| 2004/0029391 A1 | 2/2004 | Kirkpatrick et al. | |
| 2004/0033662 A1 | 2/2004 | Lee et al. | |
| 2004/0058090 A1 | 3/2004 | Waldfried et al. | |
| 2004/0069410 A1 | 4/2004 | Moghadam et al. | |
| 2004/0082163 A1 | 4/2004 | Mori et al. | |
| 2004/0096593 A1 | 5/2004 | Lukas et al. | |
| 2004/0096672 A1 | 5/2004 | Lukas et al. | |
| 2004/0099952 A1 | 5/2004 | Goodner et al. | |
| 2004/0101633 A1 | 5/2004 | Zheng et al. | |
| 2004/0102031 A1 | 5/2004 | Kloster et al. | |
| 2004/0152239 A1 | 8/2004 | Bao et al. | |
| 2004/0166240 A1 | 8/2004 | Rhee et al. | |
| 2004/0175501 A1 | 9/2004 | Lukas et al. | |
| 2004/0185679 A1 | 9/2004 | Ott et al. | |
| 2004/0221871 A1 | 11/2004 | Fletcher et al. | |
| 2004/0224496 A1 | 11/2004 | Cui et al. | |
| 2005/0025892 A1 | 2/2005 | Satoh et al. | |
| 2005/0032293 A1 | 2/2005 | Clark et al. | |
| 2005/0064726 A1 | 3/2005 | Reid et al. | |
| 2005/0079717 A1 | 4/2005 | Savas et al. | |
| 2005/0095840 A1 | 5/2005 | Bhanap et al. | |
| 2005/0101154 A1 | 5/2005 | Huang | |
| 2005/0112282 A1 | 5/2005 | Gordon et al. | |
| 2005/0153533 A1 | 7/2005 | Hoshino et al. | |
| 2005/0156285 A1 | 7/2005 | Gates et al. | |
| 2005/0161821 A1 | 7/2005 | Lee et al. | |
| 2005/0164497 A1 | 7/2005 | Lopatin et al. | |
| 2005/0170104 A1 | 8/2005 | Jung et al. | |
| 2005/0191803 A1 | 9/2005 | Matsuse et al. | |
| 2005/0194619 A1 | 9/2005 | Edelstein et al. | |
| 2005/0208758 A1 | 9/2005 | Lu et al. | |
| 2005/0260357 A1 | 11/2005 | Olsen et al. | |
| 2005/0260420 A1 | 11/2005 | Collins et al. | |
| 2005/0272220 A1 | 12/2005 | Waldfried et al. | |
| 2006/0024976 A1 | 2/2006 | Waldfried et al. | |
| 2006/0027929 A1 | 2/2006 | Cooney et al. | |
| 2006/0063662 A1 | 3/2006 | Hata et al. | |

| | | | |
|---|---|---|---|
| 2006/0105106 A1 | 5/2006 | Balseanu et al. | |
| 2006/0118817 A1 | 6/2006 | Haisma | |
| 2006/0121208 A1 | 6/2006 | Siegel | |
| 2006/0142143 A1 | 6/2006 | Abrevaya et al. | |
| 2006/0145304 A1 | 7/2006 | Boyanov et al. | |
| 2006/0216839 A1 | 9/2006 | Shenesh et al. | |
| 2006/0220251 A1 | 10/2006 | Kloster | |
| 2006/0246672 A1 | 11/2006 | Chen et al. | |
| 2006/0260538 A1 | 11/2006 | Ye et al. | |
| 2006/0269693 A1* | 11/2006 | Balseanu et al. | 427/569 |
| 2007/0015355 A1 | 1/2007 | Lin et al. | |
| 2007/0032024 A1 | 2/2007 | Peidous et al. | |
| 2007/0042581 A1 | 2/2007 | Sano et al. | |
| 2007/0054504 A1 | 3/2007 | Chen et al. | |
| 2007/0105292 A1 | 5/2007 | Chen et al. | |
| 2007/0132054 A1 | 6/2007 | Arghavani et al. | |
| 2007/0134821 A1 | 6/2007 | Thakur et al. | |
| 2007/0134907 A1 | 6/2007 | Ikeda et al. | |
| 2007/0161230 A1 | 7/2007 | Chen et al. | |
| 2007/0189961 A1 | 8/2007 | Iacopi et al. | |
| 2007/0196011 A1 | 8/2007 | Cox et al. | |
| 2007/0222081 A1 | 9/2007 | Chen et al. | |
| 2007/0224824 A1 | 9/2007 | Chen et al. | |
| 2007/0275569 A1 | 11/2007 | Moghadam et al. | |
| 2007/0281497 A1 | 12/2007 | Liu et al. | |
| 2007/0287240 A1 | 12/2007 | Chen et al. | |
| 2008/0009141 A1 | 1/2008 | Dubois et al. | |
| 2008/0020591 A1 | 1/2008 | Balseanu et al. | |
| 2008/0026579 A1 | 1/2008 | Lai et al. | |
| 2008/0132055 A1 | 6/2008 | Nguyen et al. | |
| 2008/0199977 A1 | 8/2008 | Weigel et al. | |
| 2008/0254643 A1 | 10/2008 | Clevenger et al. | |
| 2008/0286697 A1 | 11/2008 | Verhaverbeke et al. | |
| 2008/0305600 A1 | 12/2008 | Liao et al. | |
| 2009/0017640 A1 | 1/2009 | Huh et al. | |
| 2009/0039475 A1 | 2/2009 | Shioya | |
| 2009/0059406 A1* | 3/2009 | Powers et al. | 359/889 |
| 2010/0018460 A1 | 1/2010 | Singh et al. | |
| 2010/0261349 A1 | 10/2010 | Van Schravendijk et al. | |
| 2010/0267231 A1 | 10/2010 | Van Schravendijk et al. | |
| 2010/0317198 A1 | 12/2010 | Antonelli et al. | |
| 2011/0045610 A1 | 2/2011 | Van Schravendijk et al. | |
| 2011/0111533 A1 | 5/2011 | Varadarajan et al. | |
| 2011/0117678 A1 | 5/2011 | Varadarajan et al. | |

FOREIGN PATENT DOCUMENTS

| | | |
|---|---|---|
| JP | 63-307740 | 12/1988 |
| JP | 01-107519 | 4/1989 |
| JP | 09-306892 | 11/1997 |
| JP | 11214364 A | 8/1999 |
| JP | 2006165573 | 6/2006 |
| KR | 2000-0043888 | 7/2000 |
| WO | 2006/104583 | 10/2006 |
| WO | 2006/127463 | 11/2006 |
| WO | 2007/043206 | 4/2007 |

OTHER PUBLICATIONS

U.S. Office Action mailed Sep. 19, 2008, from U.S Appl. No. 11/824,049.
U.S. Final Office Action mailed Jul. 10, 2008, from U.S Appl. No. 10/807,680.
U.S. Final Office Action mailed Jul. 9, 2008, from U.S Appl. No. 10/982,654.
U.S. Office Action mailed May 14, 2008, from U.S Appl. No. 11/519,445.
U.S. Final Office Action mailed May 2, 2008, from U.S Appl. No. 11/115,576.
U.S. Office Action mailed Oct. 17, 2008, from U.S Appl. No. 11/115,576.
U.S. Office Action mailed Jul. 23, 2008, from U.S Appl. No. 11/622,423.
U.S. Appl. No. 11/590,661, Office Action mailed Apr. 6, 2009.
U.S. Appl. No. 11/811,048, Office Action mailed Mar. 19, 2009.
Rodriquez, J.A. et al., "Evolution of the mechanical stress on PECVD silicon oxide films under thermal processing", Journal of Materials Science Letters 19, 2000, pp. 1399-1401.
U.S. Appl. No. 11/606,340, Office Action mailed Feb. 5, 2009.
U.S. Appl. No. 11/824,049, Office Action mailed Mar. 19, 2009.
U.S. Appl. No. 10/982,654, Office Action mailed Dec. 4, 2008.
U.S. Appl. No. 11/519,445, Office Action mailed Dec. 10, 2008.
U.S. Appl. No. 10/972,084, Office Action mailed Dec. 30, 2008.
U.S. Appl. No. 11/115,576, Office Action mailed Apr. 22, 2009.
Draeger et al., "Creation of Porosity in Low-K Films by Photo-Disassociation of Imbedded Nanoparticles," U.S. Appl. No. 12/369,384, filed Feb. 11, 2009.
U.S. Appl. No. 11/688,695, Office Action mailed Jun. 11, 2009.
U.S. Appl. No. 11/975,473, Office Action mailed Mar. 23, 2009.
U.S. Appl. No. 11/975,473, Office Action mailed Oct. 28, 2008.
U.S. Appl. No. 11/975,473, "Use of VHF RF plasma to deposit high tensile stress films with improved film properties for use in strained silicon technology", Varadarajan et al., filed Oct. 18, 2007.
U.S. Appl. No. 10/972,084, Varadarajan et al. (Oct. 22, 2004), "Tensile Dielectric Films Using Uv Curing".
Bhadri Varadarajan et al., "Development of High Stress SiN Films for Use with Strained Silicon Technologies"; Proc. 68$^{th}$ Symp. on Semiconductors and IC Tech.; Kyoto 2005.
R. Arghavani, et al., "Strain Engineering in Non-Volatile Memories", Semicondutor International, Apr. 1, 2006.
U.S. Appl. No. 11/824,049, Notice of Allowance mailed Jun. 22, 2009.
U.S. Appl. No. 11/824,049, Allowed Claims. Jun. 26, 2009.
U.S. Appl. No. 11/696,102, Office Action mailed Jul. 1, 2009.
Yu, J.J. et al., "UV Annealing of Ultrathin Tantalum Oxide Films", Applied Surface Science, V 186 (2002), 57-63.
U.S. Appl. No. 11/811,048, Notice of Allowance mailed Aug. 17, 2009.
U.S. Appl. No. 11/811,048, Allowed Claims. Oct. 8, 2009.
U.S. Appl. No. 11/369,311, Office Action mailed Aug. 20, 2009.
U.S. Appl. No. 11/608,056, Office Action mailed Aug. 20, 2009.
Varadarajan et al., "Tensile dielectric films using UV curing", U.S. Appl. No. 10/972,084, filed Oct. 22, 2004.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$-SiH$_4$ Llasma", J. Electrochem. Soc., vol. 137 (2) 1990.
Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.
Jiang et al., "Tensile dielectric films using UV curing", U.S. Appl. No. 11/899,683, filed Sep. 7, 2007.
U.S. Appl. No. 11/899,683, Office Action mailed May 29, 2009.
U.S. Appl. No. 11/519,445, Office Action mailed Aug. 26, 2009.
U.S. Appl. No. 11/622,409, Office Action mailed Jul. 1, 2009.
Haverkamp et al., "Enhancing adhesion of cap layer films", U.S. Appl. No. 11/731,581, filed Mar. 30, 2007.
U.S. Appl. No. 11/731,581, Office Action mailed Jun. 1, 2009.
U.S. Appl. No. 11/115,576, Office Action mailed Oct. 1, 2009.
U.S. Appl. No. 11/975,473, Office Action mailed Oct. 9, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 11/622,409, Office Action mailed Nov. 5, 2009.
U.S. Appl. No. 11/519,445, Office Action mailed Nov. 4, 2009.
U.S. Appl. No. 10/972,084, Office Action mailed Nov. 27, 2009.
Haverkamp, et al., "Multi-Station Sequential Curing of Dielectric Films," Novellus Systems, Inc., U.S. Appl. No. 11/977,792, filed Oct. 25, 2007.
Haverkamp, ct al., "Progressive UV Cure," Novellus Systems, Inc., U.S. Appl. No. 12/210,060, filed Sep. 12, 2008.
U.S. Appl. No. 11/696,102, Final Office Action mailed Dec. 22, 2009.
U.S. Appl. No. 11/369,311, Office Action mailed Jan. 5, 2010.
U.S. Appl. No. 11/688,695, Final Office Action mailed Dec. 31, 2009.
U.S. Appl. No. 11/590,661, Final Office Action mailed Jan. 25, 2010.
U.S. Appl. No. 11/656,661, Office Action mailed Jan. 22, 2010.
U.S. Appl. No. 11/731,581, Office Action mailed Feb. 4, 2010.

U.S. Appl. No. 11/899,683, Office Action mailed Feb. 8, 2010.
Wu, et al., "Methods for Fabricating Zeolite Nano-Crystal Based Low-K Dielectric Films Containing Si (CxHy)n. Groups and Treating Films by Ultra-Violet Thermal Processing," Novellus Systems, Inc., U.S. Appl. No. 12/172,089, filed Jul. 11, 2008.
U.S. Appl. No. 11/977,792, Office Action mailed Mar. 9, 2010.
Chaabouni, H. et al., "Porous SiOCH Ultra Low-K recovery treatments after direct CMP process", Advanced Metallization Conference, Sep. 2008.
Chaabouni, H. et al., "Sidewall restoration of porous ultra low-k dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S. Appl. No. 11/608,056, Office Action mailed Mar. 23, 2010.
U.S. Appl. No. 11/975,473, Office Action mailed Mar. 25, 2010.
Takagi et al., "High Rate Deposition of a-SiN$_x$:H by VHF PECVD", Mat. Res. Soc. Symp. Proc. vol. 467, 1997, Materials Research Society.
U.S. Appl. No. 12/726,263, "Apparatus for UV damage repair of low K films prior to copper barrier deposition", van Schravendijk et al., filed Mar. 17, 2010.
U.S. Appl. No. 11/519,445, Notice of Allowance mailed Apr. 21, 2010.
U.S. Appl. No. 11/561,834, Office Action mailed May 21, 2010.
U.S. Appl. No. 12/840,192, "Sequential deposition / anneal film densification method", Tarafdar et al., filed Jul. 20, 2010.
U.S. Appl. No. 11/688,695, Office Action mailed Jul. 23, 2010.
U.S. Appl. No. 11/590,661, Notice of Allowance mailed Aug. 6, 2010.
U.S. Appl. No. 11/656,661, Final Office Action mailed Aug. 24, 2010.
U.S. Appl. No. 12/172,089, Office Action mailed Sep. 13, 2010.
Li, Shuang et al., "Organic-functionalized pure-silica-zeolite MFI low-k films", Chem. Mater. 2005, 17, Mar. 9, 2005, pp. 1851-1854.
U.S. Appl. No. 11/731,581, Final Office Action mailed Sep. 2, 2010.
U.S. Appl. No. 10/972,084, Office Action mailed Oct. 15, 2010.
U.S. Appl. No. 11/977,792, Office Action mailed Oct. 25, 2010.
U.S. Appl. No. 11/975,473, Office Action mailed Nov. 1, 2010.
U.S. Appl. No. 11/608,056, Notice of Allowance mailed Nov. 2, 2010.
U.S. Appl. No. 12/566,514, Office Action mailed Jan. 11, 2011.
U.S. Appl. No. 11/561,834, Final Office Action mailed Dec. 3, 2010.
U.S. Appl. No. 11/696,102, Office Action mailed Jan. 26, 2011.
U.S. Appl. No. 11/688,695, Office Action mailed Feb. 1, 2011.
U.S. Office Action mailed Dec. 12, 2007, from U.S. Appl. No. 11/146,456.
U.S. Final Office Action mailed Jul. 25, 2008, from U.S Appl. No. 11/146,456.
U.S. Appl. No. 11/146,456, Notice of Allowance mailed Nov. 10, 2008.
U.S. Appl. No. 11/146,456, Supplemental Notice of Allowance mailed Dec. 15, 2008.
Draeger et al., "Creation of Porosity in Low-K Films by Photo-Disassociation of Imbedded Nanoparticics," U.S. Appl. No. 12/369,384, filed Feb. 11, 2009.
U.S. Office Action mailed Feb. 22, 2011, from U.S Appl. No. 12/369,384.
U.S. Appl. No. 11/369,311, Office Action mailed Apr. 13, 2011.
U.S. Appl. No. 12/172,089, Final Office Action mailed Apr. 14, 2011.
U.S. Appl. No. 10/972,084, Office Action mailed May 2, 2011.
U.S. Appl. No. 11/656,661, Office Action mailed May 19, 2011.
U.S. Appl. No. 11/731,581, Office Action mailed Jun. 2, 2011.
U.S. Appl. No. 12/646,830, "UV and reducing treatment for K recovery and surface clean in semiconductor processing", Varadarajan et al., filed Dec. 23, 2009.
U.S. Appl. No. 11/977,792, Office Action mailed Jul. 6, 2011.
U.S. Appl. No. 12/646,830, Office Action mailed Jul. 15, 2011.
Notice of Allowance for U.S. Appl. No. 12/566,514, mailed Jul. 13, 2011.
Allowed Claims as of Jul. 13, 2011 for U.S. Appl. No. 12/566,514.

U.S. Appl. No. 11/696,102, Final Office Action mailed Aug. 11, 2011.
Notice of Allowance for U.S. Appl. No. 12/369,384, mailed Aug. 19, 2011.
Allowed Claims as of Aug. 19, 2011 for U.S. Appl. No. 12/369,384.
Korean Notification of Provisional Rejection mailed Dated Jul. 12, 2011 for Application No. 10-2010-0066153.
U.S. Appl. No. 11/369,311, Final Office Action mailed Sep. 29, 2011.
U.S. Appl. No. 12/973,549, Office Action mailed Oct. 11, 2011.
U.S. Appl. No. 11/977,792, Office Action mailed Oct. 24, 2011.
U.S. Appl. No. 10/972,084, Office Action mailed Oct. 27, 2011.
U.S. Appl. No. 11/656,661, Final Office Action mailed Nov. 10, 2011.
Cho et al., "Plasma Treatments of Molecularly Templated Nanoporous Silica Films," Electrochemical and Solid-State Letters, 4 (4) G35-G38 (2001).
Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 Pages.
Watkins et al., "Mesoporous Materials and Methods," U.S. Appl. No. 10/301,013, filed Nov. 21, 2002, 34 Pages.
Justin F. Gaynor, "In-Situ Treatment of Low-K Films With a Silylating Agent After Exposure to Oxidizing Environments," U.S. Appl. No. 10/056,926 filed Jan. 24, 2002, 34 Pages.
Jan, C.H., et al, *90NM Generation, 300mm Wafer Low k ILD/Cu Interconnect Technology*, 2003 IEEE Interconnect Technology Conference.
Gangpadhyay et al., "The First International Surface Cleaning Workshop," Northeastern University, Nov. 11-14, 2002.
Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.
U.S. Office Action mailed Sep. 7, 2004, from U.S Appl. No. 10/672,311.
U.S. Office Action mailed Dec. 28, 2004, from U.S Appl. No. 10/672,311.
Peter Singer, "New Materials and Designs to Improve Transistor Performance", Apr. 1, 2004, Semiconductor International.
Ghani et al, "A 90nm High Volume Manufacturing Logic Technology Featuring Novel 45nm Gate Length Strained Silicon CMOS Transistors", IEEE, © 2003.
Bhadri N. Varadarajan, "Tensile Silicon Nitride—P1264 NESL", C & F Study, Aug. 21, 2003.
U.S. Office Action mailed Mar. 2, 2005, from U.S Appl. No. 10/860,340.
U.S. Final Office Action mailed Jun. 13, 2005, from U.S. Appl. No. 10/860,340.
Draeger et al., "Creation of Porosity in Low-K Films by Photo-Disassociation of Imbedded Nanoparticles," U.S. Appl. No. 11/146,456, filed Jun. 6, 2005.
Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.
U.S. Final Office Action mailed Jul. 13, 2005, from U.S. Appl. No. 10/672,311.
U.S. Office Action mailed Jan. 10, 2006, from U.S Appl. No. 10/672,311.
U.S. Office Action mailed Mar. 29, 2006, from U.S. Appl. No. 10/800,377.
Kelman et al., "Method for Reducing Stress in Porous Dielectric Films", U.S. Appl. No. 11/369,311, filed Mar. 6, 2006.
U.S. Office Action mailed Jun. 28, 2006, from U.S Appl. No. 10/825,888.
U.S. Office Action mailed Dec. 27, 2006, from U.S Appl. No. 10/825,888.
Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 1-29.

Kamian et al., "Ultra Violet Light Treatment Load Lock for Dielectric Films," Novellus Systems, Inc., U.S. Appl. No. 11/561,834, filed Nov. 20, 2006, pp. 1-25.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

Vancouver et al., "PECVD Methods for Producing Ultra Low-K Dielectric Films Using UV Treatment," U.S. Appl. No. 11/608,056, filed Dec. 7, 2006, pp. 1-34.

Tarafdar et al., "Sequential Deposition/Anneal Film Densification Method", Novellus Systems, Inc., filed Sep. 11, 2006, U.S. Appl. No. 11/519,445, pp. 1-37.

Schravendijk, "UV Treatment of FSG Films to Improve Film Stability," Novellus Systems, Inc., U.S. Appl. No. 11/622,423, filed Jan. 11, 2007, pp. 1-31.

Schravendijk, et al., "UV Treatment of STI Films for Stress," Novellus Systems, Inc., U.S. Appl. No. 11/811,048, filed Jun. 7, 2007.

Notice of Allowance and Fee Due mailed May 22, 2006, from U.S Appl. No. 10/672,311.

Allowed Claims from U.S. Appl. No. 10/672,311, May 22, 2006.

Notice of Allowance and Fee Due mailed Apr. 4, 2007, from U.S. Appl. No. 10/825,888.

Allowed Claims from U.S. Appl. No. 10/825,888, Apr. 7, 2007.

Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.

Notice of Allowance and Fee Due mailed Oct. 10, 2006, from U.S. Appl. No. 10/800,377.

Allowed Claims from U.S. Appl. No. 10/800,377, Oct. 10, 2006.

U.S. Office Action mailed Nov. 28, 2007, from U.S. Appl. No. 10/807,680.

R.J. Lewis, Sr., Hawley's Condensed Chemical Dictionary, $12^{th}$ Edition, Van Nostrad Reinhold Co., New York, 1993 (no month), excerpts pp. 916-918 & 1123-1124.

Notice of Allowance and Fee Due mailed Dec. 20, 2005, from U.S Appl. No. 10/860,340.

Allowed Claims from U.S. Appl. No. 10/860,340, Dec. 20, 2006.

U.S. Office Action mailed Oct. 3, 2007, from U.S. Appl. No. 11/115,576.

Shaviv et al., "UV Treatment to Improve Integrity and Performance of Front End Dielectrics," Novellus Systems, Inc., U.S. Appl. No. 11/622,409, filed Jan. 11, 2007.

van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.

Shrinivassan et al., "Multi-Station Sequential Curing of Dielectric Films," Novellus Systems, Inc., U.S. Appl. No. 11/688,695, filed Mar. 20, 2007.

Van den Hoek, et al., "VLSI Fabrication Processes for Introducing Pores Into Dielectric Materials," Novellus Systems, Inc., U.S. Appl. No. 11/606,340, filed Nov. 28, 2006.

U.S. Office Action mailed Jan. 10, 2008, from U.S Appl. No. 11/622,423.

* cited by examiner

CASCADED CURE APPROACH TO FABRICATE HIGHLY TENSILE SILICON NITRIDE FILMS

FIELD OF THE INVENTION

This invention relates to electronic devices and associated fabrication processes. More specifically, the invention relates to highly tensile dielectric films on heat sensitive substrates formed by UV curing, for example implemented in strained transistor architecture for NMOS devices in which a highly tensile silicon nitride capping layer is provided on the source and drain regions to induce tensile strain in the NMOS channel region.

BACKGROUND OF THE INVENTION

As transistors are scaled to smaller dimensions there is a need for higher switching speeds. One solution to increase transistor speed is to strain the silicon in the channel. Adding strain to the silicon lattice structure is believed to promote higher electron and hole mobilities, which increase transistor drain current and device performance.

One explanation for an increase in strain to improve device performance is a change in electron symmetry. When a silicon lattice is under tensile strain, its physical symmetry is broken, and with it the electronic symmetry. The lowest energy level of the conduction band is split, with two of the six original states dropping to a lower energy level and four rising to a higher energy level. This renders it more difficult for the electrons to be 'scattered' between the lowest energy states by a phonon, because there are only two states to occupy. Whenever electrons scatter, their motion is randomized. Reducing scatter increases the average distance an electron can travel before it is knocked off course, increasing its average velocity in the conduction direction. Also, distorting the lattice through tensile strain can distort the electron-lattice interaction in a way that reduces the electron's effective mass, a measure of how much it will accelerate in a given field. As a result, electron transport properties like mobility and velocity are improved and channel drive current for a given device design is increased in a strained silicon channel, leading to improved transistor performance.

Transistor strain has been generated in NMOS devices by using a highly tensile post-salicide silicon nitride capping layer on the source and drain regions. The stress from this capping layer is uniaxially transferred to the NMOS channel through the source-drain regions to create tensile strain in the NMOS channel. For example, a 1000 Å silicon nitride capping layer with a stress of 1 GPa has been shown to provide a 10% NMOS $I_{DSAT}$ gain (saturation drain current) from tensile channel strain (Ghani, et al., A 90 nm High Volume Manufacturing Logic Technology Featuring Novel 45 nm Gate Length Strained Silicon CMOS Transistors, IEEE (2003), incorporated by reference herein in its entirety for all purposes). However, a tensile stress in excess of 1E10 dynes/cm$^2$ is necessary for optimal results.

A highly tensile silicon nitride capping layer may be deposited using a thermal CVD process, e.g., LPCVD. However, these processes generally require temperatures of greater than 500° C. to remove hydrogen from the capping layer to induce tensile stress in the capping layers, and at these higher temperatures the underlying NiSi (silicide/salicide) substrate for the capping layer undergoes a phase transformation that increases its resistivity. NiSi structures require temperature of less than about 400° C. to avoid the resistivity increase. NiPtSi gate electrodes has better thermal stability then NiSi, but even NiPtSi structures still require temperatures of less than about 480° C. Hence, thermal budget constraints for future transistor architectures require the films to be deposited at temperatures below than about 480° C., preferably below than about 400° C. A lower temperature thermal anneal may be used, for example, one in which the anneal temperature does not exceed 480° C. However, the duration of a thermal anneal process at that temperature that is necessary to obtain the benefit (e.g., about 2 hours) is not economically viable, and neither is the stress achieved sufficiently high.

Accordingly, fabrication processes for generating greater NMOS transistor channel strain are desirable.

SUMMARY OF THE INVENTION

The present invention addresses this need by providing a processing technique to generate a highly tensile dielectric layer on a heat sensitive substrate while not exceeding thermal budget constraints. Cascaded ultraviolet (UV) irradiation is used to produce highly tensile films to be used, for example, in strained NMOS transistor architectures. Successive UV radiation of equal or shorter wavelengths with variable intensity and duration selectively breaks bonds in the SiN film and minimizes shrinkage and film relaxation. Higher tensile stress than a non-cascaded approach may be obtained.

Ultraviolet (UV) irradiation is used to produce highly tensile films to be used, for example, in strained NMOS transistor architectures. UV curing of as-deposited PECVD silicon nitride films, for example, has been shown to bring about significant hydrogen removal and shrinkage, resulting in tremendous stress changes. Films with stresses of at least 1.65 GPa have been successfully produced using this technique at a temperature of 480° C. Even higher stresses are in demand, since device performance continues to increase with stress. The methods of the present invention create greater stresses by varying UV wavelengths, intensity, and duration to target specific bonds in the SiN film In one aspect, the present invention pertains to a method of fabricating a highly tensile dielectric layer on a heat sensitive substrate. The method includes providing the heat sensitive substrate, depositing a dielectric layer on the substrate, exposing the dielectric layer UV radiation of a first wavelength or wavelength range at a temperature less than about 480° C., and repeating the exposure one or more times with shorter wavelengths or wavelength ranges in successive exposures. Thus, each exposure operation may apply UV radiation of a particular wavelength or wavelength range, and a mixture of specific wavelength or wavelength ranges may be used in a sequence. Each wavelength or wavelength range is at most equal to or shorter than the previous wavelength or range. The cascaded approach results in a higher tensile stress in the dielectric film than the non-cascaded approach. The dielectric film may be a silicon nitride, a silicon carbide, oxygen-doped silicon carbide, nitrogen-doped silicon carbide, silicon boron nitride, silicon boron carbide, silicon oxide, and combinations thereof. In certain embodiments, the dielectric film is silicon nitride or a doped silicon nitride capping layer on the source and drain regions of an NMOS device.

In certain embodiments, the first wavelength or wavelength range may include only wavelengths longer than about 300 nm, preferably about 300-800 nm. After the first UV exposure, subsequent exposures having shorter wavelengths are conducted. In one example, the UV exposure operation may be repeated three times. A first repeat exposure may have a wavelength within or range of about 295-800 nm; a second range may have a wavelength within or range of about 280-800 nm; and a third range may have a wavelength within or range of about 225-800 nm. In certain embodiments, the substrate may be exposed only to UV radiation having a wavelength longer than about 200 nm, or 225 nm, or preferably longer than about 250 nm. In some cases, depending on the film being cured and rate of cure, a final stage cure wherein the film is exposed to all the available wavelengths, even if the wavelength is shorter than the cut-off in the previous stage from the broadband source (or specific wavelengths like 222 nm, 172 nm etc. if using an excimer lamp) may be used.

In certain embodiments, a long pass filter is used to narrow the wavelength ranges of a broadband UV source, which may emit radiation from about 170 nm to the infrared region (about 1-10 micron). A long pass filter may be used to attenuate, or reduce, intensity of UV wavelengths passing through to filter those that are shorter than a certain cut-off wavelength. A long pass filter may be a number of dielectric layers with optical properties and thicknesses tuned to certain UV wavelengths. A long pass filter may be used with a short pass filter to create a bandpass filter that only allows UV radiation of certain wavelength range to pass. A bandpass filter may pass radiation of a broad range, such as 300 nm to 800 nm, or a narrow range, such as 250 nm to 260 nm. The wavelengths not transmitted are either reflected or absorbed by the filter material.

In addition, or instead of, using a broadband UV source, a singular wavelength source such as a laser may be used. An excimer laser can emit UV radiation in specific wavelengths depending on the molecule used for the electrical stimulation. For example, using $Xe_2^*$, $KrCl^*$, KrF, XeBr and XeCl, UV radiation having a wavelength of 172 nm, 222 nm, 248 nm, 282 nm and 308 nm, respectively can be generated. In some cases, the radiation emitted by the excimer laser is scanned across the face of the substrate to completely expose the entire substrate. In other cases, multiple lasers may be used to form a pattern, which may be also scanned. Also, excimer lamps may also be used, wherein the emitted UV wavelength is quasi-monochromatic. A quasi-monochromatic wavelength is a spectrum having a defined peak and a defined range for full width at half maximum (FWHM). For example, a quasi-monochromatic spectrum may have a peak at 222 nm with a FWHM of 10 nm.

In certain embodiments, the methods of the present invention may employ a multi-station chamber. The stations in the chamber include apparatus for exposing the substrate to one or more UV radiation wavelengths or a wavelength range. The substrate may be transferred sequentially from station to station and be exposed to differing UV wavelengths, intensities, and for different durations. An example chamber may have four stations, each with one or more UV radiation sources and, optionally, one or more filters.

By utilizing this cascaded approach, very high tensile stresses may be achieved. The tensile stress may be higher than $1.5E10$ dynes/$cm^2$ or 1.5 Gigapascal (GPa), preferably higher than $1.65E10$ dynes/$cm^2$ or 1.65 GPa, or even more preferably higher than 1.8 GPa.

In certain embodiments, the present invention pertains to a method of fabricating a highly tensile dielectric layer by providing a heat sensitive substrate, depositing a dielectric layer on the substrate, and exposing the dielectric layer to ultraviolet radiation having a wavelength or wavelength range longer than about 250 nm. In these embodiments, the tensile stress induced may be higher than the stresses achieved with ultraviolet radiations that include wavelengths shorter than about 250 nm. The exposure may be repeated one or more times with UV radiation of shorter wavelengths with successive exposures, but at all times longer than 250 nm.

These and other aspects and advantages of the invention are described further below and with reference to the drawings.

DETAILED DESCRIPTION OF THE INVENTION

Figure 1A:
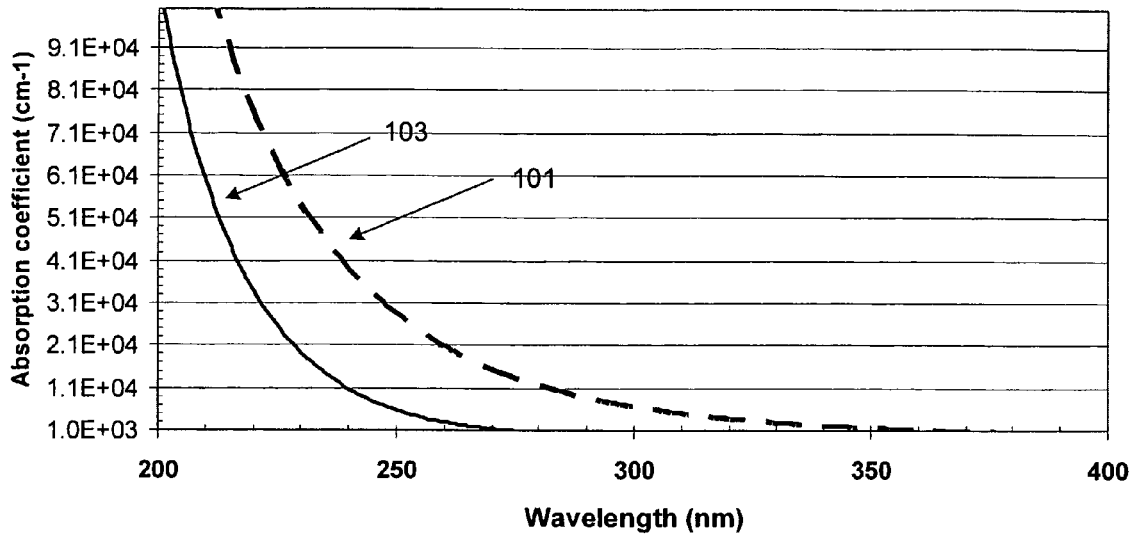
FIG. 1A shows a plot of absorption spectra for a silicon nitride film before and after UV curing for 10 minutes.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention provides a processing technique to generate a highly tensile dielectric layer on a heat sensitive substrate while not exceeding thermal budget constraints. Ultraviolet (UV) radiation is used to produce highly tensile films to be used, for example, in strained NMOS transistor architectures. UV curing of as-deposited PECVD silicon nitride films using broadband UV sources, for example, has been shown to produce films with stresses of at least $1.65 E10$ dynes/$cm^2$, or 1.65 GPa. Other dielectric capping layer film materials show similar results. In transistor implementations, the stress from a capping layer composed of such a film is uniaxially transferred to the NMOS channel through the source-drain regions to create tensile strain in NMOS channel. The architecture has been developed for 90 nm logic technology on 300 mm substrates, although it is not so limited in application. As the technology nodes advances to 65 nm and smaller, higher stresses are required to maintain the same device performance as the films becomes thinner. Additionally, device performance continues to improve with increased stresses. Thus, greater stresses continue to be desired.

In the conventional process, broadband UV radiation is used, having wavelengths range from less than 200 nm all the way to infrared. Absorption of the radiation in the UV region, followed by bond-breaking and $H_2$ removal, and subsequent stress generation has been the mechanism. The broadband UV radiation breaks the Si—H, N—H, and Si—N bonds in the film. After the Si—H and N—H bonds are broken and the hydrogen diffuses out of the film, the dangling silicon and nitrogen bonds form a SiN network. After Si—N bonds are broken, the bonds reform in a preferred energy pathway.

Significant tensile stress is generated within the first few minutes of cure (<10 min) accompanied by high shrinkage. With increasing cure time, the rate of stress generation drops off significantly, and continued curing brings about a stress reversal (stress starts decreasing). Although not intending to be bound by this theory, the reason for the stress saturation and reversal may be two-fold: first, decreasing hydrogen concentration in the film and increased compaction (due to shrinkage) makes it difficult to continue evolving hydrogen from the film. Hydrogen diffusion through the film depends on many factors, including time, film temperature, microstructure of the film, and concentration of hydrogen in the film. As the film shrinks, the hydrogen evolution decreases to a point where further bond breaking does not increase the SiN network because the hydrogen is unable to diffuse out. While a decrease in hydrogen diffusion accounts for stress saturation, the stress reduction is likely due to a relaxation phenomenon.

The stress relaxation phenomenon may be caused by the reformation of Si—N bonds in a lower energy state. As the film cures, the number of Si—H and N—H bonds decreases, leaving more Si—N in the film. Since the film is exposed to a broadband source, radiation in the shorter wavelengths (higher energy) continues to break the Si—N backbone. While these bonds immediately reform, they reform in a less-strained configuration. Hence it is not possible to generate higher stresses by curing longer as more configurations are reformed in a less-strained manner.

Figure 1B:
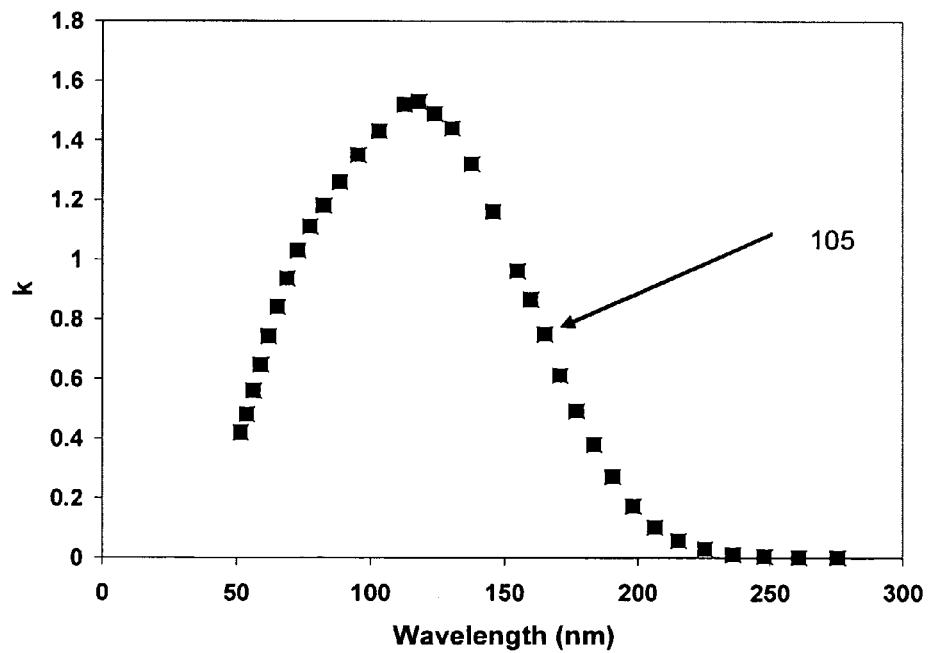
FIG. 1B shows a plot of absorption spectrum of an as deposited silicon nitride film with very little hydrogen in it.

Film stress may be increased if breaking of the Si—N backbone is minimized while continuing to break hydrogen bonds and evolve the hydrogen. The present invention reduces breaking of the Si—N backbone by exploiting the difference in absorption spectrum of the Si—H, N—H, and Si—N bonds. FIG. 1A shows the absorption spectra a high tensile nitride film as-deposited, as line 101. Upon curing the film for 10 minutes, the absorption curve shifts to the left to the shorter wavelengths (shown as line 103), with absorption terminating at about 270 nm, effectively terminating at about 250 nm, where the absorption is only about 3% of that at 190 nm. FIG. 1B shows the absorption spectra (105) for a SiN film deposited at high temperature on a CVD reactor. As discussed above, high temperature CVD SiN film has very little hydrogen in it. FIG. 1B shows that the absorption terminates at about 225 nm for such a film. Because the high temperature SiN film has mostly only Si—N bonds, it follows that Si—N absorbs radiation only lower than 225 nm. FIG. 1A also supports this conclusion, as evidenced by Si—H and N—H bonds' absorption of UV radiation between curves 101 and 105, estimated to be above 225 nm, preferably 225-350 nm.

In one aspect, the present invention involves generating tensile stress in dielectric films by treating the films with UV radiation of shorter wavelengths or wavelength ranges in successive exposures, while maintaining all UV radiation at a wavelength of a cut-off value and longer. In one embodiment, the present invention involves generating tensile stress by treating a silicon nitride film with UV radiation at a wavelength of 225 nm and longer. The cut-off limits on the wavelengths are guides to determine the appropriate wavelength to use. The silicon nitride film has a cut-off wavelength of 225 nm. Other variants of the same SiN film, or other films such as SiC, SiCN, SiBN, etc. will each have their own cut-off limits.

Post-Deposition UV Treatment of Dielectric Layer

The post-deposition UV treatment, also referred to as UV curing, technique of the invention generates a highly tensile dielectric layer on a heat sensitive substrate without thermally degrading the substrate. In a particular implementation, source/drain salicide capping layer stress in NMOS transistors is increased without thermally degrading the salicide. The technique involves post-deposition UV treatment of a capping layer film on a heat sensitive substrate, e.g., a silicide (or salicide) such as NiSi. In a specific embodiment, the capping layer is composed of silicon nitride (SiN or $Si_3N_4$) deposited by PECVD and the invention is primarily described herein with respect to this embodiment. In alternative embodiments, however, the capping layer may be deposited by other thermal CVD process, e.g., low pressure CVD (LPCVD), atmospheric pressure CVD (APCVD) or other suitable techniques such as spin-coating, print-coating, and dip-coating, and be composed of other dielectric materials including silicon carbide (SiC), oxygen-doped silicon carbide (SiCO), nitrogen-doped silicon carbide (SiCN), silicon boron nitride (SiBN), silicon boron carbide (SiBC), and silicon oxide (SiO or $SiO_2$), and the invention should be understood to apply to these capping layer materials as well. Further the present invention also applies to other situations where greater stresses are desirable and may be induced by tailoring successive UV exposures at a wavelength known to break particular bonds to form a desired cured structure.

PECVD films in general contain a considerable amount of hydrogen. For example, PECVD silicon nitride films contain generally contain about 15-30% hydrogen in the form of Si—H and N—H bonds. Again, while the invention is not limited by this theory, it is generally accepted that irreversible tensile stress develops in PECVD films from the reduction of the amount of hydrogen in the film, and due to shrinkage of voids. The loss of hydrogen and shrinkage of voids result in a volume reduction in the film. But the constraint of the substrate prevents any lateral shrinkage, thus imposing tensile strains in the film. The change in hydrogen concentration has been shown to be proportional to the irreversible stress change. Thermal annealing at temperatures in excess of 500° C., e.g., 600° C., are also known to remove the hydrogen from such a film (silicon nitride) by providing sufficient energy to attain the right bonding configuration and stoichiometry, in particular the removal of H and formation of extended Si—N bonds. These temperatures, however, exceed the thermal budget constraints, leading to, for example, higher resistivity of NiSi. In some cases, annealing at these temperatures may adversely affect the partially fabricated circuits and films.

It has now been found that UV irradiation is a source of energy that makes compressive films tensile and tensile films even more tensile. It is believed that the photons from the UV source for example, a "H bulb" of a Hg lamp having a nominal wavelength from about 150 nm to 800 nm and an intensity of between 1 $\mu W/cm^2$ and 10 $W/cm^2$, provide sufficient energy to break most H-bonds in a dielectric film, e.g., for a silicon nitride film, the Si—H and N—H bonds. UV irradiation has a penetration depth sufficient to treat a film of full thickness, for example, between about 50 and 30,000 Å, e.g., about 300-1500, such as 700 Å. A following gas, such as He, Argon or $N_2$ may be used as a purging gas during UV curing to remove evolved hydrogen. Alternatively or in addition, the chamber may be evacuated. Other reactive gases such as $O_2$, $CO_2$, $N_2O$, $H_2$, $H_2O$ vapor, and vapors of alcohols (such as methanol, ethanol, isopropyl alcohol [IPA]) may be used to further control the UV curing process. The process pressure may vary between 10 to 1000 Torr. At a moderate substrate temperature (e.g., between about 25-500° C.) and UV exposure, the H atoms from neighboring broken bonds combine to form $H_2$ that diffuses out of the film. The removal of hydrogen leaves behind micro voids in the film, along with the voids formed during deposition. The photon energy from the UV source, coupled with the thermal energy due to the substrate temperature cause these voids to shrink (in order to minimize surface energy). This shrinkage imposes significant tensile strains in the film.

The substrate temperature during the UV treatment is affected by the device and film on the partially fabricated circuit. The use of nickel monosilicide (NiSi) layers constrains the substrate temperature to less than 400° C., and nickel platinum silicide (NiPtSi), to less than about 480° C.

The UV treatment may be implemented in a continuous mode or pulsing mode to further optimize the end result on the final film. In a continuous exposure mode, the film is irradiated with a continuous UV source. In a pulsing mode, the film is exposed to pulses of UV radiation, leading to a sequence of curing/quenching/curing/quenching events. By modulating the pulse length, the intensity of the pulses, and the spectra of the radiation, the film stress and other properties may be further optimized.

Table 1, below, provides suitable PECVD deposition conditions for a silicon nitride layer suitable as a capping layer in accordance with the present invention:

TABLE 1

| Parameter | Range |
| --- | --- |
| $SiH_4$ (sccm) | 100-300 |
| $NH_3$ (sccm) | 1000-7000 |
| $N_2$ (sccm) | 5000-15000 |
| He (sccm) | 2000-10000 |
| HFRF (W) | 300-1200 |
| Pressure (Torr) | 5-15 |
| Temperature (° C.) | $250 \leq X \leq 480$ |

Figure 2A:
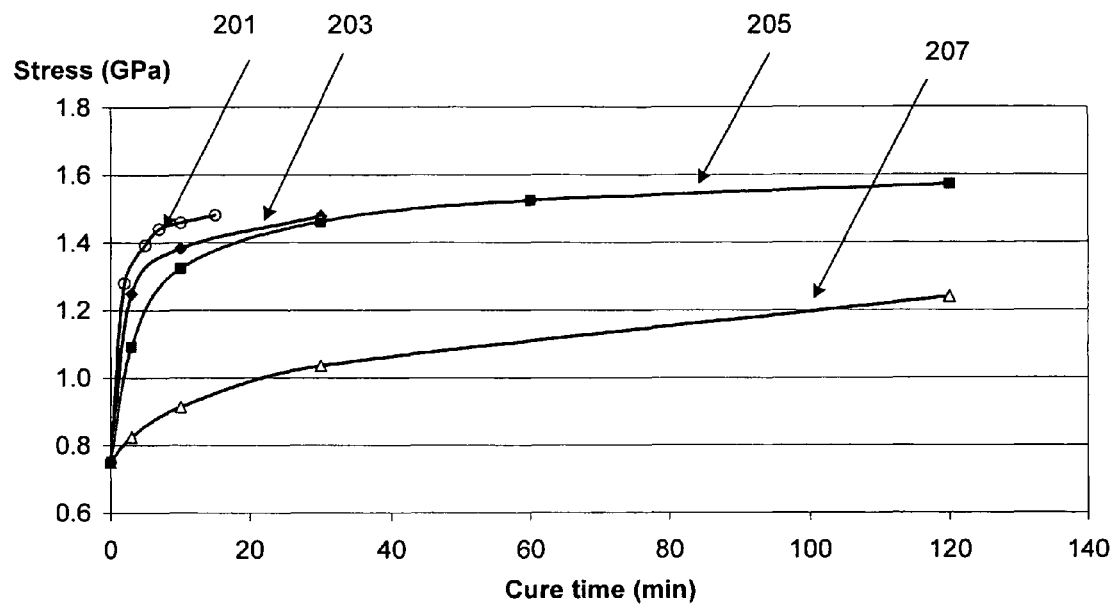
FIG. 2A is a plot of the increase in tensile stress with UV curing time for PECVD silicon nitride films using different radiation sources.

FIG. 2A shows a plot of the effect of UV curing time and wavelength on the stress of a PECVD silicon nitride film cured at 400° C. Line 201 shows the tensile stress as function of cure time for a broadband UV source. The film stress saturated at relatively short cure time as compared to other UV sources, achieving 1.48 GPa. Line 203 shows the tensile stress for a 172 nm source. As discussed above, radiation at a wavelength of 172 nm is shorter, and has higher energy, than the Si—N bond breaking radiation at 225 nm. As expected, the stress also saturated after a relatively short cure time, but not as short as the broadband source. The highest stress was achieved using radiation having a wavelength of 222 nm, which was up to 1.58 GPa. Even after 120 minutes, the stresses appeared to be continuing to increase. Further curing may achieve even higher stresses. Line 207 shows the tensile stress for a 308 nm source. The stress obtained was lower, but increasing. The low stress may be caused by the low intensity of radiation used in this test (and the low absorption at this wavelength).

Figure 2B:
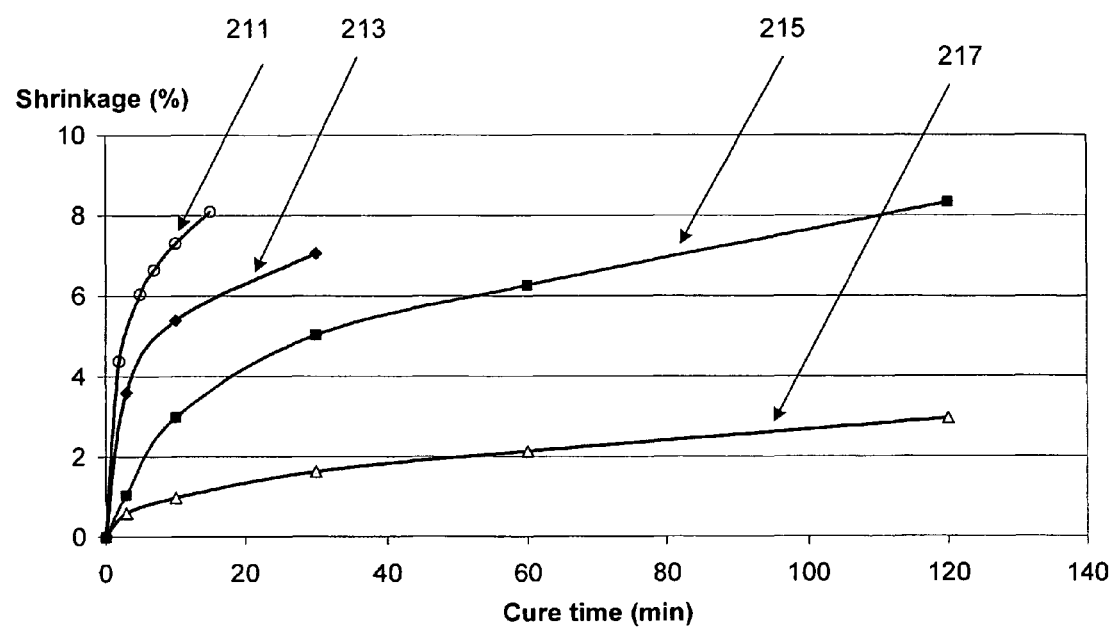
FIG. 2B is a plot of the shrinkage with UV curing time for PECVD silicon nitride films using different radiation sources.

FIG. 2B shows a plot of film shrinkage for the same test. As discussed above, shrinkage is associated with void reduction in the film, and adversely affects hydrogen diffusion in the film. The more a film shrinks, the less hydrogen would evolve from it as the film becomes more compacted. Thus, it is desirable to delay the shrinkage until a desired amount of hydrogen has evolved from the film. Consistent with the shorter cure time to stress saturation of lines 201 and 203, the film shrinkage of lines 211 and 213 increased to 8% and 7%, respectively, in a short amount of time. Lines 215 and 217, on the other hand, shows a more graduated shrinkage mirroring the tensile stress lines.

Figure 3A:
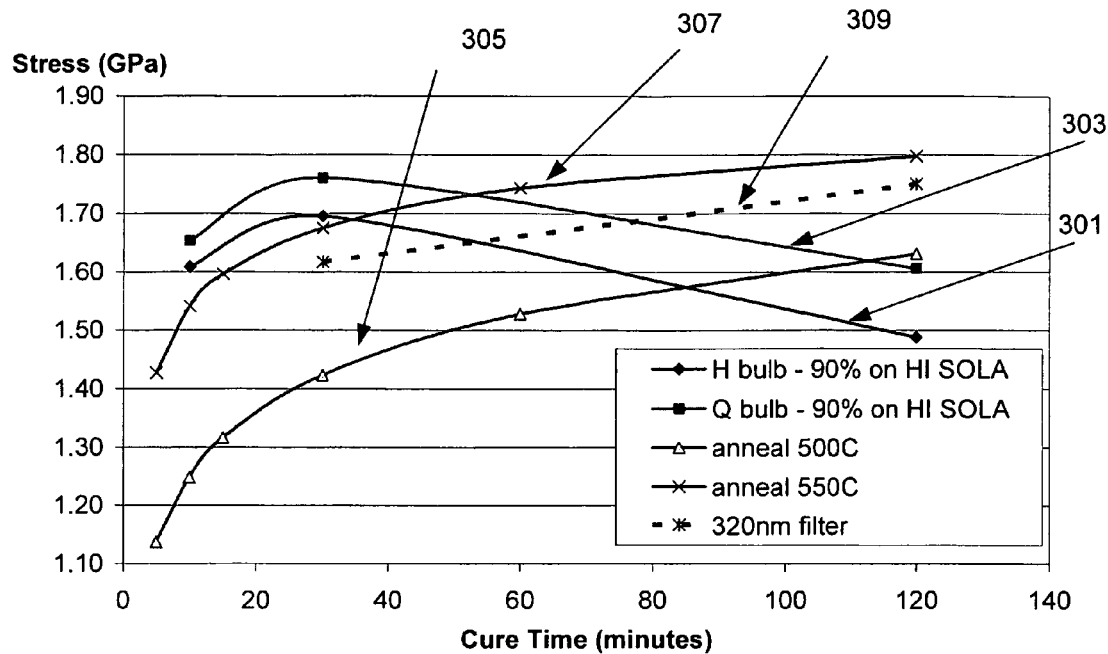
FIG. 3A is a plot of the change in tensile stress with curing time for PECVD silicon nitride films comparing UV cure using various sources and high temperature anneal.

The phenomenon of stress saturation and relaxation is shown on FIG. 3A, as lines 301 and 303. Lines 301 and 303 show film stresses on a 700 Å Si—N film at various cure times under a broadband source. Different UV bulbs were used. At first, the film stresses increased rapidly, consistent with the bond breaking, hydrogen diffusion, and reformation mechanism discussed above. The stresses reached a peak at about 30 minutes of cure time in a stress saturation phenomenon and decreased slowly and the reformed bonds relax the Si—N network. After 120 minutes, the tensile stresses in the film were less than that after about 10 minutes of cure time. For broadband sources, longer cure times did not yield higher stresses.

On the other hand, the curves shown for thermal anneal at 500° C. (line 305) and 550° C. (line 307) had different slopes from the broadband UV cure. The stresses increased rapidly at first until about 20 minutes of cure, then increased less rapidly. The stresses continued to increase even after 120 minutes of curing, showing no relaxation phenomenon. The stress obtained at a higher temperature anneal is higher, as evidenced by comparing line 307 to 305. Note however, anneal temperatures of 550° C. and even 500° C. are likely to be above the thermal budget for the underlying NiSi or NiPtSi layers. Line 309 shows the film stresses over time for curing at 480° C. with a broadband UV source with a 320 nm long-pass filter. A long-pass filter allows wavelengths longer than the specified wavelengths to pass. The 320 nm long-pass filter would allow UV radiation of wavelengths of about 320-800 nm to pass and filter out shorter wavelengths for a broadband source having an output of about 170-800 nm. Line 309 has the same slope as that of 307 and 305, both thermal anneals, but a lower substrate temperature than both 307 and 305. The stresses obtained at a lower temperature UV cure (line 309 at 480° C.) were higher than that of higher temperature thermal anneal (line 305 at 500° C.). Although at the highest stress obtained for the filtered UV cure did not reach the peak for the broadband cure, the line had an upward slope and with continued curing would surpass the maximum stress from the broadband UV cure.

Figure 3B:
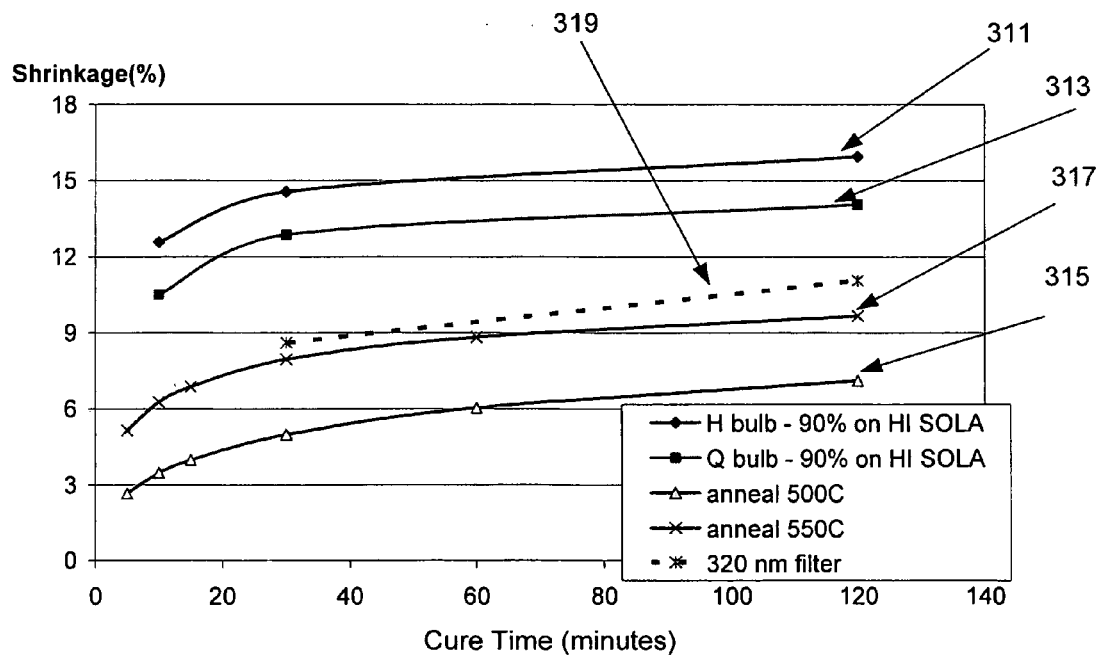
FIG. 3B is a plot of the change in shrinkage with curing time for PECVD silicon nitride films comparing UV cure using various sources and high temperature anneal.

FIG. 3B shows the shrinkage percentage for films exposed to various curing techniques. Shrinkage was highest for the broadband UV sources (lines 311 and 313) and lowest for the thermal anneal (lines 315 and 317). Line 319 shows the shrinkage values for a broadband UV source with a 320 nm long-pass filter. Although line 319 shows higher shrinkage percentages than that of thermal anneal, the shrinkage rates were significantly lower than the broadband lines (311 and 313). The result demonstrates that the UV wavelengths shorter than 320 nm, those blocked out by the filter, cause the higher shrinkage.

Test results depicted in FIGS. 2 and 3 show that at a wavelength longer than 225 nm, UV cure would continue to increase film stresses even after prolonged curing, after about 120 minutes. The results at wavelengths longer than 320 nm compares favorably to thermal anneals at higher temperatures. Thus, film stresses may be increased further by limiting the UV wavelengths to those longer than 225 nm, preferably longer than 250 nm.

In order to minimize the shrinkage while driving out the maximum possible hydrogen, a cascading approach may be used. The cascading approach involves sequentially exposing the film to wavelengths above a particular cut-off wavelength that is increasingly shorter. For example, FIG. 1 shows the absorption of the as-deposited film begins at about 330 nm. Exposing the film to wavelengths only above, e.g., 305 nm, will break the H terminated bonds, liberating $H_2$ and generating stress. In addition, since this cut-off is far away form the wavelength at which Si—N starts absorbing, Si—N bond breaking would be minimized. But after some time of cure, the absorption curve of the film moves to shorter wavelengths. After this time, there will be no more or very little absorption of any radiation that has a wavelength longer than 305 nm.

The next step at that time would be to expose the films only to wavelengths above, e.g., 295 nm. Once the film has sufficiently cured at this wavelength, and the absorption curve has moved below the cut-off wavelength, the film can then be exposed to a lower wavelength radiation, e.g., 280 nm. This progression can continue until finally the film is exposed to radiation at wavelengths near the S—N bond breaking range, e.g., greater than 225 nm, or preferably grater than about 250 nm. The cascaded approach maximizes $H_2$ removal, while minimizing the amount of time that the film is exposed to high energy (lower wavelength) radiation which minimizes the matrix bond-breaking and stress relaxation. Although the example above uses cut-off wavelengths at 305 nm, 295 nm, 280 nm, and 250 nm, the invention is not so limited. Different cut-off wavelengths may be chosen. In some cases, more than one exposure at the same wavelength or range of wavelengths may occur.

Figure 4:
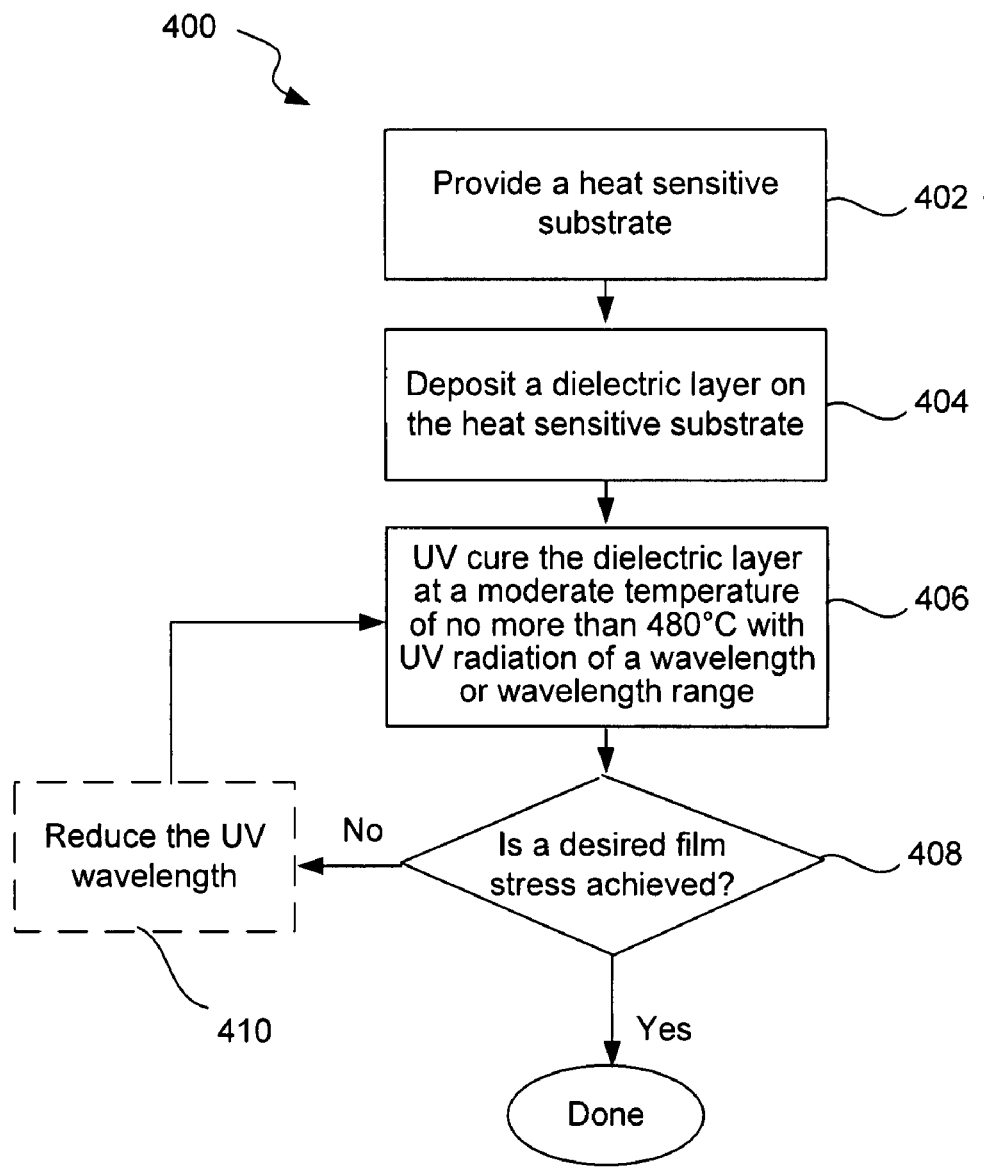
FIG. 4 depicts a process flow diagram for a method of fabricating a high tensile stress dielectric film in accordance with an embodiment of the present invention.

FIG. 4 is an example process diagram for the cascaded approach. The method 400 involves providing a heat sensitive substrate (402), such as layer of silicide. The dielectric layer is formed by depositing a dielectric, such as silicon nitride, on the silicide substrate by a CVD process, e.g., PECVD, at a temperature of no more than 480° C. (404). Other dielectrics such as silicon carbide, oxygen-doped silicon carbide, nitrogen-doped silicon carbide, silicon boron nitride, silicon boron carbide, silicon oxide, and combinations thereof may also be deposited. The deposited dielectric is then exposed to UV radiation at a particular wavelength or wavelength range at a moderate temperature, for example, between about 250 and 480° C. (406). The UV radiation may reach the substrate through a filter, for example from Hg lamp having a nominal wavelength from about 150 nm to 800 nm, through a longpass filter for 300 nm, resulting in wavelengths of about 300 nm to 800 nm reaching the substrate. Alternatively, a non-broadband source may be used that produces UV radiation at a particular wavelength or wavelengths.

Table 2, below, provides an example of typical UV curing conditions for a silicon nitride layer suitable as a capping layer in accordance with the present invention:

TABLE 2

| Parameter | Range |
| --- | --- |
| He flow (sccm) | 3000-15000 |
| Substrate Temperature | 380-480° C. |
| UV Power (W/cm$^2$) | 1.0-3.0 |
| Pressure (Torr) | 5-200 |

In a cascaded approach after the first exposure, a decision is made whether the desired film stress is achieved (408). After the first period of exposure the film may not absorb further at the longer wavelengths, as evidenced by a shifting of absorption curve (see FIG. 1). The wavelength or wavelengths range may be reduced (410) for the next exposure step at the new wavelength or wavelengths (406). After the desired film stress is achieved, the process is complete. Note that each successive exposure operation may be for different durations and at different intensities. The first exposure may be longer at a higher intensity than the second exposure.

Figure 5:
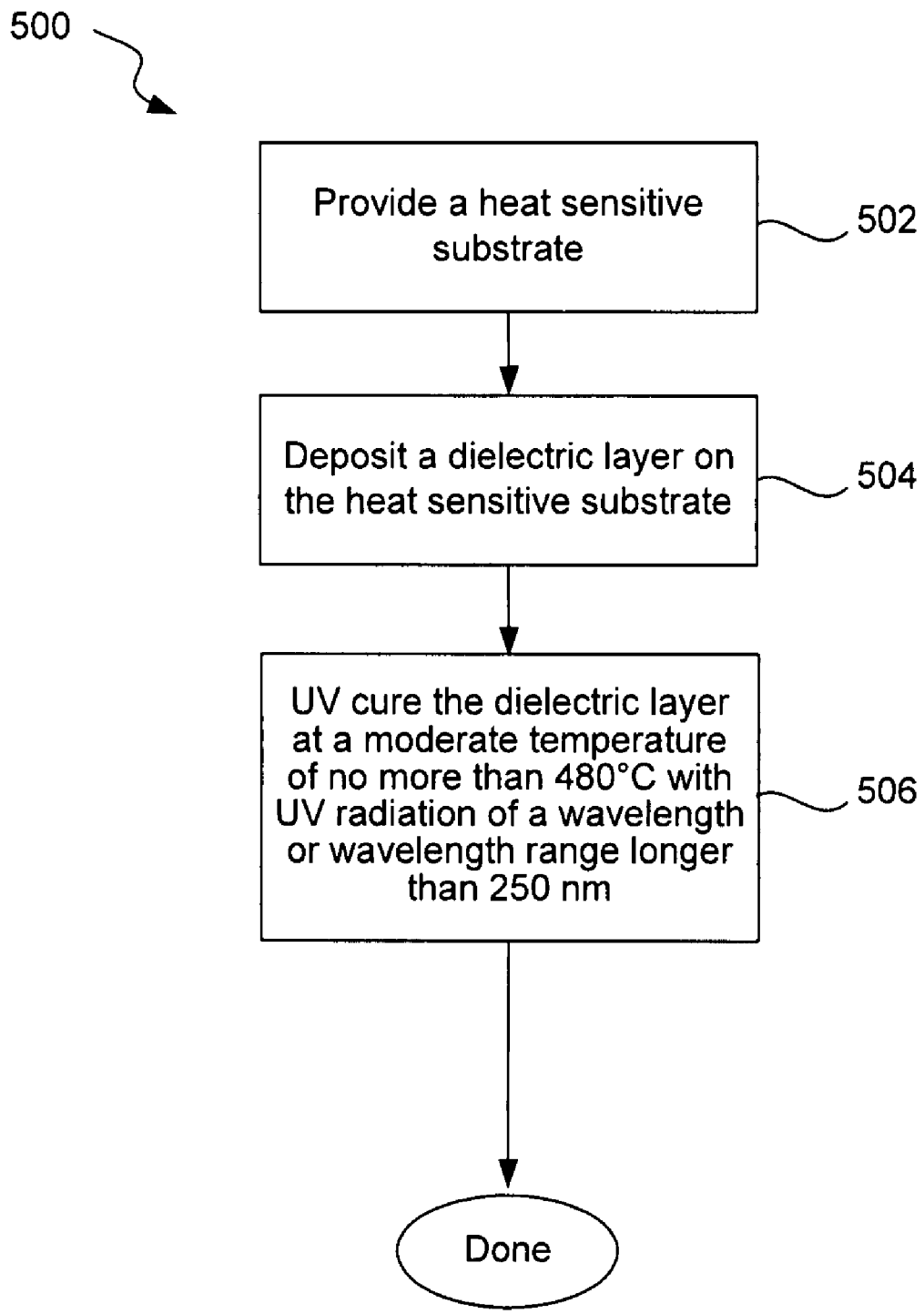
FIG. 5 depicts a process flow diagram for a method of fabricating a high tensile stress dielectric film in accordance with an embodiment of the present invention.

In an alternative embodiment, a non-cascaded approach with a frequency cutoff may be taken, as shown in FIG. 5. In this example, the method 500 involves providing a heat sensitive substrate (502), such as layer of silicide. The dielectric layer is formed by depositing a dielectric, such as silicon nitride, on the silicide substrate by a CVD process, e.g., PECVD, at a temperature of no more than 480° C. (504). The deposited dielectric is then exposed to UV radiation at a particular wavelength or wavelength range at a moderate temperature, for example, between about 250 and 480° C. (506). The UV radiation may have wavelengths greater than a cut-off wavelength, e.g., about 200 nm, 225 nm, or preferably greater than 250 nm. The particular cut-off wavelength to use depends on the material being cured. The exposure may be at one or more wavelength ranges, as long as all UV radiation used are longer than the cut-off wavelength. This approach avoids unwanted stress relaxation by reducing UV radiations that would break Si—N bonds; however, the substrate shrinkage may reduce hydrogen diffusion and evolution.

Transistor Architecture

Figure 6:
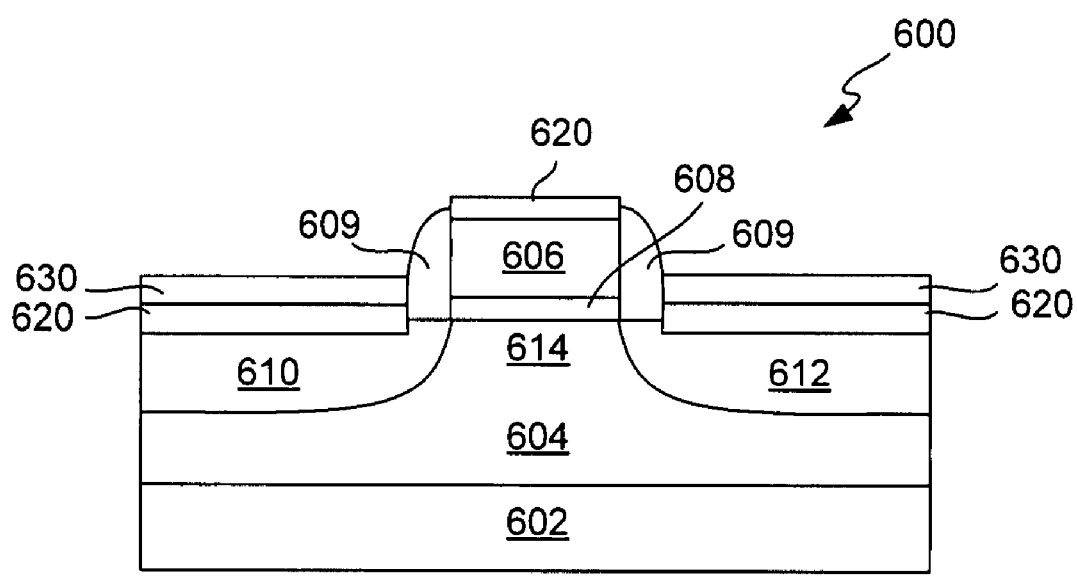
FIG. 6 depicts a simple transistor architecture in accordance with an embodiment of the present invention.

The present invention may be specifically applied to straining an NMOS channel by inducing stress in a silicon nitride capping layer. As shown in FIG. 6, an example NMOS transistor structure includes a p-doped substrate 602, an n-doped well 604 within the substrate 602, a conductive gate 606 separated from the n-well 604 of the substrate 602 by a gate dielectric 608 and p-doped source 610 and drain 612 regions in the well 604 on either side of the gate 606, and a channel 614 region underlying the gate 606. There may also be sidewall spacers 609 on the gate 606. The source 610 and drain 612 regions and the gate 606 are covered with a layer of self-aligned silicide (salicide) 620, and the salicide is covered with a silicon nitride (SiN) capping layer 630.

UV curing the capping layer 630 by exposure to UV radiation breaks Si—H and N—H bonds in the film. Hydrogen is removed from the capping layer, and tensile stress in the capping layer is induced. The tensile stress is transferred to the NMOS channel through the source and drain regions resulting in a strained channel. As discussed above, channel strain improves electron mobility and therefore device performance.

Apparatus

The present invention can be implemented in many different types of apparatus. Generally, the apparatus will include one or more chambers (sometimes referred to as process reactors) that house one or more substrates and are suitable for semiconductor processing. At least one chamber will include a UV source. A single chamber may be employed for all operations of the invention or separate chambers may be used. Each chamber may house one or more substrates for processing. The one or more chambers may maintain the substrates in a defined position or positions (with or without motion within that position, e.g., rotation, vibration, or other agitation) during UV treatment operations. For certain operations in which the substrate is to be heated, the apparatus may include a heating platen.

In certain embodiments, the cascading cure process, or generally, multi-operation cure process, is performed using a multi-station cure chamber. As discussed above, in certain embodiments, the multiple operation cure processes of the invention rely on being able to independently modulate the UV intensity, wavelength, spectral distribution and substrate temperature of each operation. Additionally, certain inert or reactive gases may be injected during the cure process at the same or different flowrates at each step. Multi-station cure chambers capable of independent modulation of the above variables are described in U.S. patent application Ser. No. 11/688,695, titled "Multi-Station Sequential Curing of Dielectric Films," which is hereby incorporated by reference in its entirety for all purposes.

Particularly, the independent control of the substrate temperature and the UV intensity is described in U.S. patent application Ser. No. 11/115,576 and in commonly assigned U.S. patent application Ser. No. 11/184,101, now U.S. Pat. No. 7,327,948 filed Jul. 18, 2005, titled "Cast Pedestal with Heating Element and Coaxial Heat Exchanger," which are hereby incorporated by reference in their entirety for all purposes. A chamber may decouple substrate temperature and UV intensity by reducing the amount of IR radiation on the substrate, which heats up the substrate, and/or providing independent heat transfer mechanisms to and from the substrate. For example, the chambers may be equipped with cold mirrors or other reflectors to reduce the amount of IR radiation incident on the substrate, the absorption of which results in temperature increase. In addition, each pedestal or other substrate support may have an independent heat transfer mechanism to help maintain a substrate temperature regardless of the UV intensity. Thus, unlike conventional UV cure chambers where substrate temperature is coupled to UV intensity, the substrate temperature and UV intensity may be independently set for a wide range of temperatures and intensities.

Figures 7A, 7B:
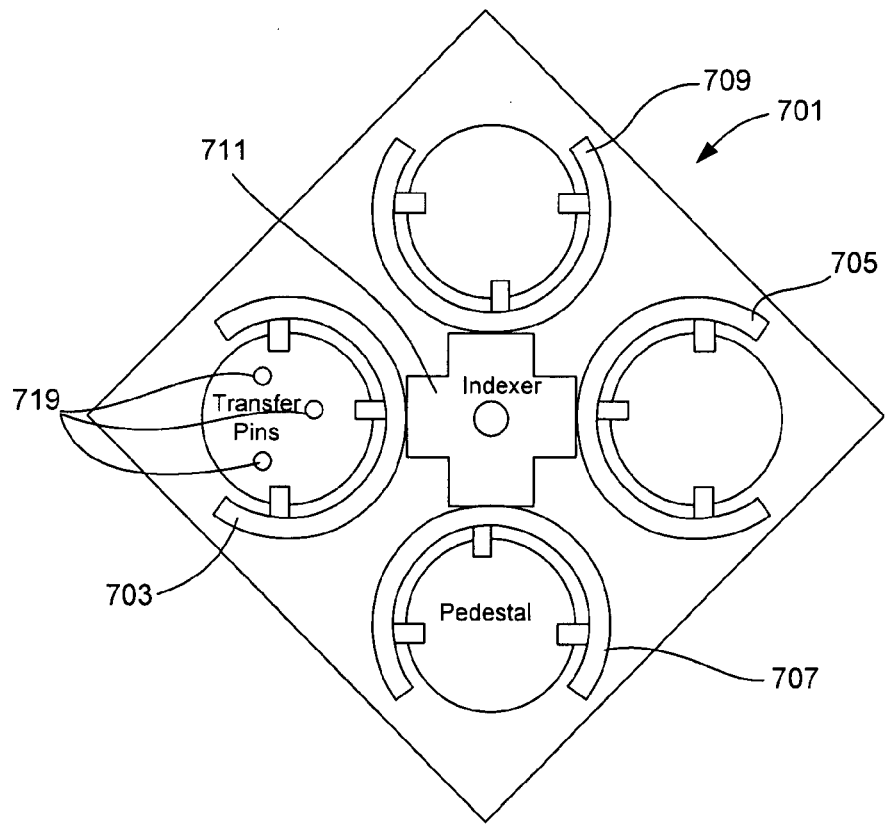
FIGS. 7A and 7B are simple block diagrams depicting a chamber configured for implementing the deposition of dielectric films in the present invention.

FIGS. 7A and 7B show one embodiment of an apparatus appropriate for use with certain embodiments of the invention that uses broadband UV sources. Chamber 701 includes multiple cure stations 703, 705, 707 and 709, each of which accommodates a substrate. Station 703 includes transfer pins 719. FIG. 7B is a side view of the chamber showing stations 703 and 705 and substrates 713 and 715 located above pedestals 723 and 725. There are gaps 704 between the substrates and the pedestals. The substrate may be supported above the pedestal by an attachment, such as a pin, or floated on gas. Parabolic or planar cold mirrors 753 and 755 are located above broadband UV source sets 733 and 735. UV light from lamp sets 733 and 735 passes through windows 743 and 745. Substrates 703 and 705 are then exposed to the radiation. In alternative embodiments, the substrate may be supported by the pedestals 723 and 725. In such embodiments, the lamps may or may not be equipped with cold mirrors. By making full contact with the pedestal, the substrate temperature may be maintained by use of a conductive gas such as helium or a mixture of helium and argon at a sufficient pressure for conductive heat transfer, typically between 20 and 760 Torr, but preferably between 100 and 600 Torr.

In operation, a substrate enters the chamber at station 703 where the first UV cure operation is performed. Pedestal temperature at station 703 is set to a first temperature, e.g. 400° C., with the UV lamps above station 703 set to a first intensity, e.g., 100% maximum intensity, and first wavelength range, e.g., about 305-800 nm. After curing in station 703 for a sufficient time such that absorption at the wavelength range is reduced, the substrate is transferred to station 705 for further curing at the same wavelength range or shorter wavelength range, e.g., 295-800 nm. Pedestal temperature at station 705 is set to a second temperature, which may or may not be the same as the first station and UV intensity is set to a second intensity, e.g. 90% intensity. Stations 707 and 709 may also be used for UV curing. For example, at station 707, the UV radiation may be at a wavelength range of 280-800 nm, and at station 709, 225-800 nm. Each substrate is sequentially exposed to each UV light source.

In order to irradiate the substrate at different wavelengths or wavelengths ranges while using a broadband UV source, which generates radiation in a broad spectrum, optical components may be used in the radiation source to modulate the part of the broad spectrum that reaches the substrate. For example, reflectors, filters, or combination of both reflectors and filters may be used to subtract a part of the spectrum from the radiation. On reaching the filter, light may be reflected, absorbed into the filter material, or transmitted through.

Long pass filters are interference filters, which provide a sharp cut-off below a particular wavelength. They are useful for isolating specific regions of the spectrum. Long pass filters are used to pass, or transmit, a range of wavelengths and to block, or reflect, other wavelengths on the shorter wavelength side of the passband. Long wavelength radiation is transmitted, while short wavelength radiation is reflected. The region of high transmittance is known as the passband and the region of high reflectance is known as the reject or reflectance band. The roll-off region separates the pass-band and reflect-band. The complexity of long pass filters depends primarily upon the steepness of the transition region and also on the ripple specifications in the passband. In the case of a relatively high angle of incidence, polarization dependent loss may occur. Long pass filters are constructed of hard, durable surface materials covered dielectric coatings. They are designed to withstand normal cleaning and handling.

Another type of filter is UV cut-off filter. These filters do not allow UV transmission below a set value, e.g. 280 nm. These filters work by absorbing wavelengths below the cut-off value. This may be helpful to optimize the desired cure effect.

Yet another optical filter that may be used to select a wavelength range is a bandpass filter. Optical bandpass filters are designed to transmit a specific waveband. They are composed of many thin layers of dielectric materials, which have differing refractive indices to produce constructive and destructive interference in the transmitted light. In this way optical bandpass filters can be designed to transmit a specific waveband only. The range limitations are usually dependant upon the interference filters lens, and the composition of the thin-film filter material. Incident light is passed through two coated reflecting surfaces. The distance between the reflective coatings determines which wavelengths will destructively interfere and which wavelengths will be allowed to pass through the coated surfaces. In situations where the reflected beams are in phase, the light will pass through the two reflective surfaces. However, if the wavelengths are out of phase, destructive interference will block most of the reflections, allowing almost nothing to transmit through. In this way, interference filters are able to attenuate the intensity of transmitted light at wavelengths that are higher or lower than the desired range.

Another filter that can attenuate the wavelengths of the radiation reaching the substrate is the window 743, typically made of quartz. By changing the level of metal impurities and water content, the quartz window can be made to block radiations of undesired wavelengths. High-purity Silica Quartz with very little metal impurity is more transparent deeper into the ultraviolet. As an example, quartz with a thickness of 1 cm will have a transmittance of about 50% at a wavelength of 170 nm, which drops to only a few percent at 160 nm. Increasing levels of impurities in the quartz cause transmission of UV at lower wavelengths to be reduced. Electrically fused quartz has a greater presence of metallic impurities, limiting its UV transmittance wavelength to around 200 nm and longer. Synthetic silica, on the other hand, has much greater purity and will transfer down to 170 nm. For infrared radiation, the transmittance through quartz is determined by the water content. More water in the quartz means that infrared radiation is more likely absorbed. The water content in the quartz may be controlled through the manufacturing process. Thus, the spectrum of radiation transmission through the quartz window may be controlled to cutoff or reduce UV transmission at shorter wavelengths and/or to reduce infrared transmission at longer wavelengths.

In addition to changing the wavelengths by altering the radiation that reaches the substrate, radiation wavelength can also be controlled by modifying the properties of the light generator. Broadband UV source can generate a broad spectrum of radiation, from UV to infrared, but other light generators may be used to emit a smaller spectrum or to increase the intensity of a narrower spectrum. Other light generators may be mercury-vapor lamps, doped mercury-vapor lamps, electrode lamps, excimer lamps, excimer lasers, pulsed Xenon lamps, doped Xenon lamps. Lasers such as excimer lasers can emit radiation of a single wavelength. When dopants are added to mercury-vapor and to Xenon lamps, radiation in a narrow wavelength band may be made more intense. Common dopants are iron, nickel, cobalt, tin, zinc, indium, gallium, thallium, antimony, bismuth, or combinations of these. For example, mercury vapor lamps doped with indium emits strongly in the visible spectrum and around 450 nm; iron, at 360 nm; and gallium, at 320 nm. Radiation wavelengths can also be controlled by changing the fill pressure of the lamps. For example, high-pressure mercury vapor lamps can be made to emit wavelengths of 250 to 440 nm, particularly 310 to 350 nm more intensely. Low-pressure mercury vapor lamps emit at shorter wavelengths.

In addition to changing light generator properties and the use of filters, reflectors that preferentially deliver one or more segments of the lamps spectral output may be used. A common reflector is a cold mirror that allows infrared radiation to pass but reflects other light. Other reflectors that preferentially reflect light of a spectral band may be used. Therefore a substrate may be exposed to radiation of different wavelengths at different stations. Of course, the radiation wavelengths may be the same in some stations.

In FIG. 7B, pedestals 723 and 725 are stationary. Indexer 711 lifts and moves each substrate from one pedestal to another between each exposure period. Indexer 711 includes an indexer plate 721 attached to a motion mechanism 731 that has rotational and axial motion. Upward axial motion is imparted to indexer plate 721 to pick up substrates from each pedestal. The rotational motion serves to advance the substrates from one station to another. The motion mechanism then imparts downward axial motion to the plate to put the substrates down on the stations.

Pedestals 723 and 725 are electrically heated and maintained at a desired process temperature. Pedestals 723 and 725 may also be equipped with cooling lines to enable precise substrate temperature control. In an alternate embodiment, a large heater block may be used to support the substrates instead of individual pedestals. A thermally conductive gas, such as helium, is used to effect good thermal coupling between the pedestal and the substrate. In some embodiments, cast pedestals with coaxial heat exchangers may be used. These are described in above-referenced U.S. patent application Ser. No. 11/184,101.

FIGS. 7A and 7B show only an example of a suitable apparatus and other apparatuses designed for other methods involved in previous and/or subsequent processes may be used. For example, in another embodiment that uses broadband UV source, the substrate support is a carousel. Unlike with the stationary pedestal substrate supports, the substrates do not move relative to the carousel. After a substrate is loaded onto the carousel, the carousel rotates, if necessary, to expose the substrate to light from a UV lamp set. The carousel is stationary during the exposure period. After the exposure period, the carousel rotates to advance each substrate for exposure to the next set of lamps. Heating and cooling elements may be embedded within the rotating carousel. Alternatively the carousel may be in contact with a heater plate or hold the substrates so that they are suspended above a heater plate.

In certain embodiments, the substrates are exposed to UV radiation from focused, rather than, flood lamps. Unlike the broadband source embodiments wherein the substrates are stationary during exposure (as in FIGS. 7A and B), there is relative movement between the substrates and the light sources during exposure to the focused lights as the substrates are scanned. In other embodiments, the substrates may be rotated relative to the light sources to average out any differences in intensity across the substrate.

Other apparatuses designed for other methods involved in previous and/or subsequent processes may be used. For example, methods of the invention may be used with a standard PECVD chamber used to deposit the precursor layer if the chamber is equipped with a UV radiation source. Some supercritical fluid chamber systems may also be configured to include a UV radiation source.

Alternate Embodiments

While the invention has been primarily described and exemplified with respect to UV exposure of a deposited film, but also applies to simultaneous UV and thermal and other treatments, or other engineered multi-step processes. For example, while it is preferable both from the perspective of process efficiency and effectiveness to deposit the dielectric to be UV cured in a single step, it is also possible to deposit and cure the dielectric in multiple repeating steps to build up a laminate dielectric with increased tensile stress and without the adverse impacts associated with thermal processing. The film stress will change with respect to the length of the treatment time, UV intensity, UV spectrum, UV operation mode such as pulse and continuous, curing environment, film thickness, and substrate curing temperature.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of fabricating a highly tensile dielectric layer on a heat sensitive substrate, comprising:
providing a heat sensitive substrate;
depositing a dielectric layer on the substrate;
exposing the dielectric layer to ultraviolet (UV) radiation having a first wavelength or first wavelength range; and
repeating the exposing operation one or more times with exposure to ultraviolet radiation, the UV radiation in each exposing operation having a wavelength or a wavelength range, wherein the wavelength or lower limit of the wavelength range is decreased with successive exposures.

2. The method of claim 1, wherein during the exposure operations the substrate is maintained at a temperature of about 250° C. to 480° C.

3. The method of claim 1, wherein the repeating operation induces a tensile stress in the dielectric layer greater than that without the repeating operation.

4. The method of claim 1, wherein the dielectric is selected from the group consisting of a silicon nitride, a silicon carbide, oxygen-doped silicon carbide, nitrogen-doped silicon carbide, silicon boron nitride, silicon boron carbide, silicon oxide, and combinations thereof.

5. The method of claim 4, wherein the dielectric is silicon nitride.

6. The method of claim 1, wherein the first wavelength comprises a range of wavelengths.

7. The method of claim 6, wherein the shorter wavelengths each comprise a range of wavelengths.

8. The method of claim 7, wherein
the first wavelength range is about 305-800 nm;
a first repeat exposure occurs in a wavelength range of about 295-800 nm;
a second repeat exposure occurs in a wavelength range of about 280-800 nm; and
a third repeat exposure occurs in a wavelength range of about 225-800 nm.

9. The method of claim 1, wherein the ultraviolet radiation includes only wavelengths longer than about 200 nm.

10. The method of claim 1, wherein the ultraviolet radiation includes only wavelengths longer than about 225 nm.

11. The method of claim 1, wherein the ultraviolet radiation includes only wavelengths longer than about 250 nm.

12. The method of claim 1, wherein the substrate further comprises an NMOS transistor.

13. The method of claim 1, wherein a long pass filter is used to narrow the wavelength range of the ultraviolet radiation emitted by a broadband source.

14. The method of claim 1, wherein a short pass filter and a long pass filter are used to narrow the wavelength range of the ultraviolet radiation emitted by a broadband source.

15. The method of claim 1, wherein the UV radiation is emitted from a UV source comprising a lamp with an emission wavelength range of 150-800 nm.

16. The method of claim 1, wherein the UV radiation is emitted from a UV source comprising a laser or excimer lamp with an emission wavelength of 172 nm, 222 nm, or 308 nm.

17. The method of claim 1, wherein the ultraviolet radiation exposure occurs in a multi-station chamber, each station comprising one or more UV radiation sources and one or more filters configured to expose the substrate to one or more UV radiation wavelengths.

18. The method of claim 1, wherein two or more ultraviolet radiation exposing operations are of unequal duration.

19. The method of claim 1, wherein the dielectric layer has a tensile stress is in excess of 1.5E10 dynes/cm$^2$ or 1.5 Gigapascal (GPa).

20. The method of claim 1, wherein the dielectric layer has a tensile stress is in excess of 1.8E10 dynes/cm$^2$ or 1.8 Gigapascal.

21. A method comprising:
depositing a dielectric layer on a substrate; and
exposing the dielectric layer to ultraviolet radiation having a wavelength longer than a cut-off wavelength;
wherein the exposing operation induces a tensile stress in the dielectric layer greater than that achieved with an ultraviolet wavelength range including wavelengths shorter than the cut-off wavelength; and
further comprising repeating the exposing operation one or more times, the UV radiation in each exposing operation having a wavelength or a wavelength range, wherein the wavelength or lower limit of the wavelength range is decreased with successive exposures.

22. The method of claim 21, wherein the dielectric is selected from the group consisting of a silicon nitride, a silicon carbide, oxygen-doped silicon carbide, nitrogen-doped silicon carbide, silicon boron nitride, silicon boron carbide, silicon oxide, and combinations thereof.

23. The method of claim 22, wherein a long pass filter is used to narrow ultraviolet radiation emitted by a broadband source to a wavelength range that includes only wavelengths longer than about 250 nm.

24. The method of claim 21, wherein the wavelength and the shorter wavelengths comprise a range of wavelengths.

25. A method comprising:
depositing a dielectric layer on a substrate;
exposing the dielectric layer to ultraviolet (UV) radiation comprising a first wavelength; and
repeating the exposing operation one or more times with exposure to ultraviolet radiation, wherein repeating the exposing operation comprises exposing the dielectric layer to radiation comprising a wavelength shorter than any wavelength used in a previous exposing operation.

* * * * *